(12) United States Patent
Rantanen et al.

(10) Patent No.: US 10,248,686 B2
(45) Date of Patent: Apr. 2, 2019

(54) SHARED DATA WITH RELATIONSHIP INFORMATION

(71) Applicant: Tekla Corporation, Espoo (FI)

(72) Inventors: Teemu Rantanen, Helsinki (FI); Ragnar Wessman, Espoo (FI)

(73) Assignee: Tekla Corporation, Espoo (FI)

( * ) Notice: Subject to any disclaimer, the term of this patent is extended or adjusted under 35 U.S.C. 154(b) by 435 days.

(21) Appl. No.: 13/923,063

(22) Filed: Jun. 20, 2013

(65) Prior Publication Data

US 2013/0346432 A1 Dec. 26, 2013

Related U.S. Application Data

(60) Provisional application No. 61/663,765, filed on Jun. 25, 2012.

(30) Foreign Application Priority Data

Jun. 21, 2012 (FI) .................................. 20125700

(51) Int. Cl.
| | | |
|---|---|---|
| G06F 17/30 | (2006.01) | |
| G06F 17/50 | (2006.01) | |
| G06F 8/35 | (2018.01) | |
| G06Q 10/10 | (2012.01) | |

(52) U.S. Cl.
CPC .......... *G06F 17/30386* (2013.01); *G06F 8/35* (2013.01); *G06F 17/30165* (2013.01); *G06F 17/30994* (2013.01); *G06F 17/50* (2013.01); *G06F 17/5004* (2013.01); *G06Q 10/101* (2013.01); *G06Q 10/103* (2013.01)

(58) Field of Classification Search
None
See application file for complete search history.

(56) References Cited

U.S. PATENT DOCUMENTS

| | | | |
|---|---|---|---|
| 5,551,028 A * | 8/1996 | Voll ........................ | G06F 17/50 |
| 5,630,125 A * | 5/1997 | Zellweger ......... | G06F 17/30994 |
| 5,634,124 A * | 5/1997 | Khoyi et al. | |
| 6,718,218 B1 * | 4/2004 | Matheson ............... | G06F 17/50 |
| | | | 700/118 |
| 6,898,560 B1 | 5/2005 | Das | |
| 7,398,129 B2 * | 7/2008 | Ishii ........................ | G06F 17/50 |
| | | | 700/104 |
| 7,567,992 B1 | 7/2009 | Edwardson et al. | |
| 7,640,259 B2 * | 12/2009 | Heger ............... | G06F 17/30961 |
| 7,742,617 B2 | 6/2010 | Smith et al. | |

(Continued)

OTHER PUBLICATIONS

Search Report for Patent Application No. 20125700 from the National Board of Patents and Registration of Finland; dated May 20, 2013, 2 pages.

(Continued)

*Primary Examiner* — David T. Brooks
(74) *Attorney, Agent, or Firm* — Kilpatrick Townsend and Stockton

(57) ABSTRACT

To enable a shared model comprising shared plans having a hierarchy with two or more levels, a data item stored in a shared plan is provided with relationship information indicating whether or not there is a previous data item in the shared plan, whether or not there is a next data item in the shared plan, and whether or not the data item has a relationship to a data item in a higher level plan.

24 Claims, 12 Drawing Sheets

(56) References Cited

U.S. PATENT DOCUMENTS

| | | | | |
|---|---|---|---|---|
| 8,082,220 | B2* | 12/2011 | Hadad | G06N 5/02 706/45 |
| 8,224,471 | B2* | 7/2012 | Pascarella | G06Q 10/06 700/97 |
| 2002/0087672 | A1* | 7/2002 | Milligan | G06F 17/30356 709/223 |
| 2003/0088447 | A1* | 5/2003 | Desbiens | G06Q 10/06 707/802 |
| 2005/0060135 | A1* | 3/2005 | Gauckler | G06F 17/50 703/22 |
| 2005/0246160 | A1* | 11/2005 | Zimmermann | G05B 19/41865 704/9 |
| 2005/0267725 | A1* | 12/2005 | Reeder | G06F 9/4443 703/22 |
| 2005/0278209 | A1* | 12/2005 | Kayahara | G06Q 10/06313 705/7.23 |
| 2006/0106485 | A1* | 5/2006 | Landers | G05B 19/4097 700/182 |
| 2006/0161516 | A1* | 7/2006 | Clarke | G06F 17/30578 |
| 2008/0140732 | A1* | 6/2008 | Wilson | G06F 17/3023 |
| 2008/0256186 | A1* | 10/2008 | Hartmann | G06Q 10/10 709/205 |
| 2008/0275742 | A1* | 11/2008 | Vermette | G06Q 10/063 705/7.11 |
| 2009/0037921 | A1* | 2/2009 | Simpson | G06Q 10/06 718/104 |
| 2009/0089552 | A1* | 4/2009 | Inchingolo | G06Q 10/06 712/216 |
| 2009/0164979 | A1 | 6/2009 | Fischer | |
| 2009/0265380 | A1* | 10/2009 | Wright et al. | 707/103 R |
| 2009/0276192 | A1* | 11/2009 | Avraham | G06F 17/5004 703/1 |
| 2010/0070241 | A1* | 3/2010 | Opdahl | G06F 17/5004 703/1 |
| 2010/0241477 | A1* | 9/2010 | Nylander | G06F 17/5004 705/7.27 |
| 2010/0251028 | A1* | 9/2010 | Reghetti | G06F 17/5004 714/39 |
| 2011/0010134 | A1 | 1/2011 | Balla et al. | |
| 2011/0022437 | A1* | 1/2011 | Mundy | G06Q 10/06 705/7.13 |
| 2011/0282704 | A1* | 11/2011 | Graeber | G06Q 10/06 705/7.11 |
| 2012/0054246 | A1* | 3/2012 | Fischer | G06F 17/30622 707/793 |
| 2012/0109592 | A1* | 5/2012 | Potter | G06F 17/50 703/1 |
| 2012/0331061 | A1* | 12/2012 | Lininger | G06F 17/5004 709/205 |
| 2013/0166538 | A1* | 6/2013 | Hadley | G06F 17/30864 707/722 |

OTHER PUBLICATIONS

Elmasri, R. and Navathe, S.B. "Fundamentals of Database Systems, 4$^{th}$ edition, Addison-Wesley, 2003" pp. 917-955, retrieved on May 8, 2013 from www.mmnt.net/db/0/0/ftp.awl.com/cseng/authors/elmasri/Dbase4e.

Singh et al., A Theoretical Framework of a BIM-based Multi-Disciplinary Collaboration Platform. Automation in Construction, vol. 20, No. 2, Mar. 2011, pp. 134-144.

* cited by examiner

SHARED DATA WITH RELATIONSHIP INFORMATION

RELATED APPLICATION

This application claims priority to FI application no. 20125700 filed Jun. 21, 2012 and to U.S. provisional application No. 61/663,765, filed Jun. 25, 2012, both of which are assigned to the applicant of the present application and are incorporated herein by reference in their entirety for all purposes.

FIELD

The invention relates to data processing, and particularly to relationship information indicating how a data item relates to other data items in shared data.

BACKGROUND ART

The following description of background art may include insights, discoveries, understandings or disclosures, or associations together with disclosures not known to the relevant art prior to the present invention but provided by the invention. Some such contributions of the invention may be specifically pointed out below, whereas other such contributions of the invention will be apparent from their context.

Computer based structured storage systems, such as computer file systems and database systems, have been remarkably successful at providing users with quick and facile access to enormous amounts of data. At the same time data management systems have been evolved for handling shared or concurrent access and update of data in a server by different clients. Evolvement of cloud computing has also introduced different data-sharing services.

The development of data processing systems, computers and computer applications has transformed different processes into computerized processes. One example of such a process is modeling. Modeling means that a model is created from a product under design for describing the product to be constructed, the model containing at least information needed to illustrate the product. For example, a product model of a building is an entity consisting of the product data on the life span of the building and building process.

To provide dynamic environment and concurrent modeling for the product model utilizing shared data, a mechanism to handle different alternatives and phases of modeling, for example, is needed.

SUMMARY

The invention relates to methods, an apparatus, a computer pro-gram product and a system which are characterized by what is stated in the independent claims. Preferred embodiments are disclosed in the dependent claims.

An aspect provides relationship information indicating relations a data item in a shared memory has to other data items in the shared memory.

An advantage of the relationship information is that it provides a mechanism to handle different alternatives and phases of modeling. Further, by means of the relationship information, shared plans having a hierarchy with two or more levels may be created and maintained.

BRIEF DESCRIPTION OF THE DRAWINGS

In the following, different embodiments will be described in greater detail with reference to the attached drawings, in which.

DETAILED DESCRIPTION OF SOME EMBODIMENTS

Exemplary embodiments of the present invention will now be de-scribed more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

The present invention is applicable to any application and/or process supporting use of shared data, any computing apparatus and corresponding component(s) configured to create and/or access and/or update/modify shared data stored on a shared data repository (memory), in any data storage system or any combination of different data storage systems, such as data repositories (memories) in a client-server structure. The data repository may be an external data repository shared by different user apparatuses, and/or the data repository may be an internal memory of a computing apparatus shared by different applications or different application instances. The methods and processes used by the applications, by the computing apparatuses, by different data managing systems, including file systems, and data repositories, are developing. Such development may require extra changes to an embodiment. Therefore, all words and expressions should be interpreted broadly and they are intended to illustrate, not to restrict, the embodiment.

In the following, different embodiments will be described using, as an example of a system architecture whereto the embodiments may be applied, an architecture based on a client-server structure and data sharing based on a "copy—modify locally" solution, without restricting the embodiments to such an architecture, however. It should be appreciated that herein the client-server structure also covers applications and/or application instances acting as the client and the common memory with its control system performing the server functionality required for that specific implementation.

Further, in the following modeling is used as an example of a process utilizing shared data and a model is used as an example of a modeling entity. Examples of such entities include a building with related information, a budget of a company having many subsidiaries, a car with specific design and manufacturing details.

Figure 1:
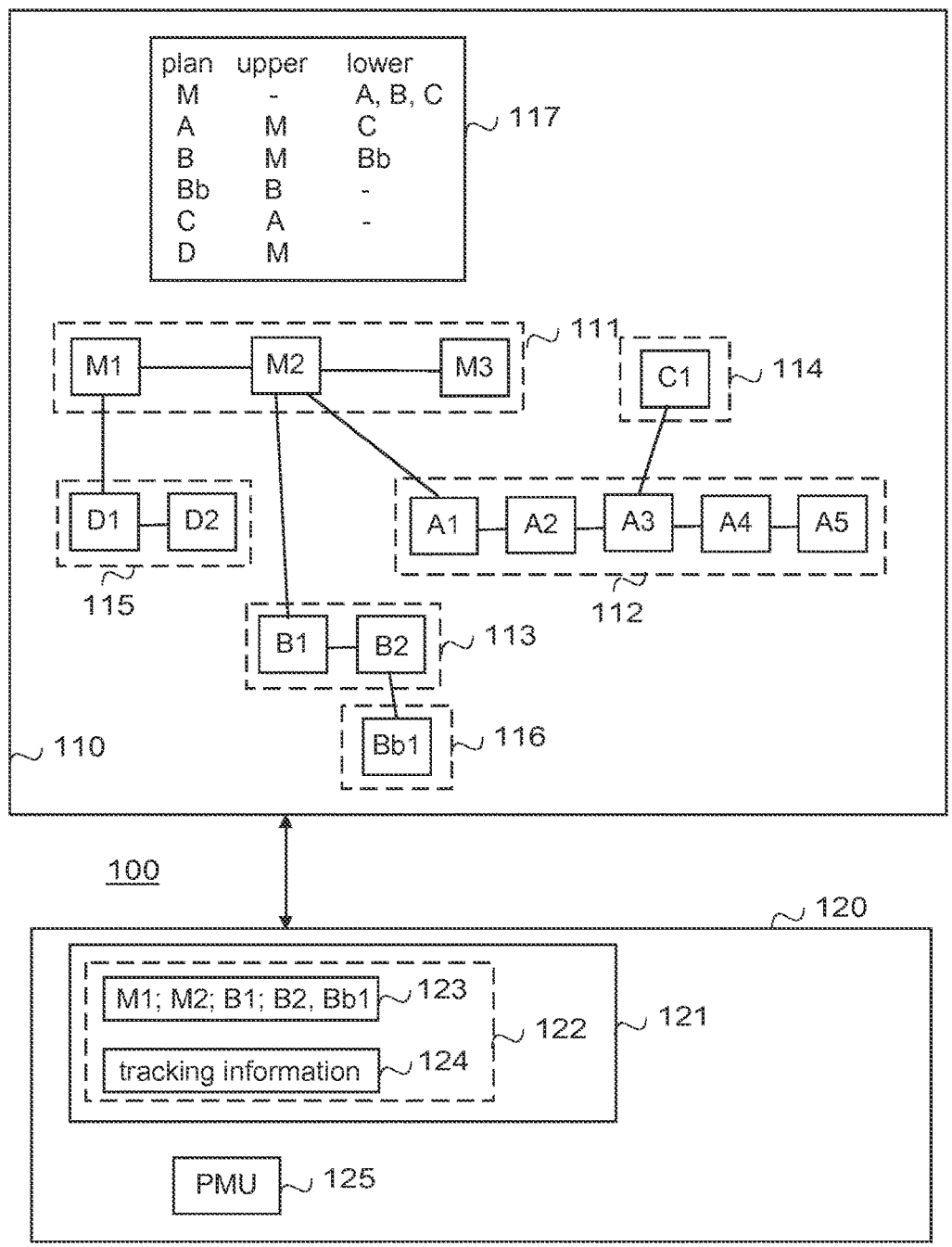
FIG. 1 is a simplified block diagram illustrating a system used as an example.

A general architecture according to an embodiment is illustrated in FIG. 1. FIG. 1 is a highly simplified system architecture only showing some elements, networks and functional entities, all being logical units whose implementation may differ from what is shown. The connections shown in FIG. 1 are examples of logical connections; the actual physical connections may be different. It is apparent to a person skilled in the art that the systems also comprise other functions and structures. It should be appreciated that the functions, structures, elements and the protocols used in or for data accessing, updating and management are irrelevant to the actual invention. Therefore, they need not be discussed in more detail here.

The system 100 illustrated in FIG. 1 comprises one or more apparatuses 120 (only one shown in FIG. 1), connected to a server system 110. The connection may be a direct connection over Bluetooth or a cable or via an USB port, for example, or a connection over a network, such as a mobile network, a public switched telephone network, a wide area network WAN, Internet, a local area network LAN open for all users or with restricted access (an enterprise LAN or office LAN, for example), or a private network.

In the example of FIG. 1, the server system 110 comprises a data repository (not illustrated separately in FIG. 1) managed by a file management system or a database management system, for example, and which is accessible by means of apparatuses 120 providing user accounts having proper access rights, for example. The management system stores contents, allowing data creation, deletion, update, maintenance and search, and may provide access, security, backup and other facilities, such as monitoring modifications to data and downloading modifications to relevant clients (or applications or application instances in client apparatuses).

The server system 110 may be one server node, or a corresponding computing apparatus, comprising a processor (s) and memory for management systems and for a data repository, or different modules and/or memory of the server system may be implemented in two or more physical or logical entities. For example, the data repository and the server system 110 may be distributed between two or more of the clients. The server system 110 may even be an internal system within a computing apparatus, for example, when data sharing is between applications that run on the computing apparatus.

The data repository may be any kind of conventional or future data repository, including distributed and centralized data storages (data warehousing), managed by any suitable management system. An example of a distributed data warehousing includes a cloud storage in a cloud environment (which may be a public cloud, a community cloud, a private cloud, or a hybrid cloud, for example). The implementation of the data repository and the way in which the shared data is stored and updated bear no significance to the invention and need not be described in detail here.

In the illustrated example, at an imaginary modeling phase, the data repository contains for a model different plans 111, 112, 113, 114, 115, 116, each plan comprising one or more data items that form the shared data of the plan in question and that are arranged to be in an unambiguous sequence (order). It should be appreciated that herein a "sequence" means the particular order in which events or actions happened, and the unambiguous sequence indicates a storing/saving/publishing order in the data repository. Herein a data item means a set of logically related data treated as a unit. It should be appreciated that what may constitute a data item depends on the application used. However, the data item itself, or information stored therein, bears no significance; the invention may be utilized with any kind of data and file format, etc., as long as the data is associated with relationship information described in more detail below. Further, shared data means herein data that is at least accessible, preferably also modifiable, by different users (by means of user apparatuses) and/or different applications and/or different application instances.

In the illustrated example, a plan 111 is a master plan. Herein, the master plan means a plan which is on the highest level i.e. does not refer to any other plan. The master plan may be called highest plan, highest level plan, supreme plan, or upmost plan, for example.

In the illustrated example, the other plans, i.e. plan A 112, plan B 113, plan C 114, plan D 115 and plan Bb 116, may be parallel or alternative plans. A parallel plan means that it is intended to be saved in the master plan (or in the higher level plan) when it is ready for storing. An alternative plan means that one of the plans that are alternative to each other, is selected to be saved in the master plan (or in the higher level plan) while the other(s) is/are not. The "leftover" plans may be deleted from the data repository or marked as such to ensure that no one uses them in further modeling. For example, plan A 112 may be alternative to plan B 113. As can be seen from the illustrated example, a plan level of plans A 112, B 113 and D 115 is one level lower than the master plan, i.e. the master plan is a higher level for them. Further, plan A 112 is a higher level plan for plan C 114, and plan B is a higher level plan for plan Bb 116. Depending on an implementation, information on a plan type (master, parallel, alternative) may or may not be maintained in the system. Further, other plan types may be introduced, and the invention may be implemented without any plan type.

In the illustrated example, at the imaginary modeling phase, plan D 115 is the only plan wherefrom data is stored back in the higher level plan (in the master plan 111).

As to building information modeling (BIM), the shared model comprising different plans may be a building information model in a multiuser environment. BIM is a digital representation of the building process to facilitate exchange and interoperability of information in digital format. For example, the information may relate to different phases of building process, and/or to different detailed information, like models of beams, columns, plates, connections between beams and columns, or connections between beams and plates, drawings, a list of elements needed for a building, etc. A plan M may illustrate a building that is currently being planned (a building intended to be built), a plan A may be a concrete frame plan for the building, a plan B a steel structure frame for the building, a plan Bb1 a plan for stiffening the steel structure frame, the plan C concrete partition wall plan, and the plan D a foundation plan for the building, or the plan A may be a plan of a contractor taking care of building the frame, the plan B may be a plan of a head structural engineer, the plan Bb1 may be a plan of an electronic designer, the plan C may be a plan of a prefabrication factory, and the plan D may relate to municipal engineering. Further, all plans may be shared plans of one party, for example the head structural engineer may have several engineers or subcontractors providing the shared plans, and the master plan may then be shared upwards as a plan to a building information model shared by different parties. It should be appreciated that file format(s) of the data items bear(s) no significance and any means to obtain data exchange between different applications may be used, if necessary.

Figure 2:
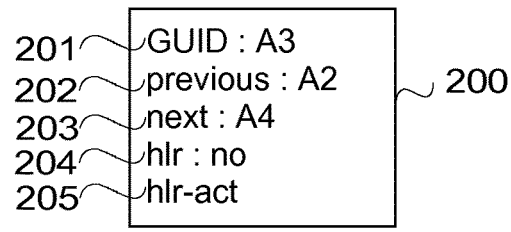
FIG. 2 illustrates packet relationship information.

To keep track of the level relationships and data item relationships, each data item stored in the shared memory contains or is associated with data item relationship information described in more detail with FIG. 2. For example, if the data item is a packet, the data item relationship information may be included in a header. By means of the data item relationship, the data items stored in the shared memory may be logically organized into plans as is shown in FIG. 1, the lines between different data items illustrating the relationship information of a corresponding data item.

In the illustrated example, the data repository also contains hierarchy information 117 for the model. The hierarchy information may be a table containing for example a name of each plan, and a name of a higher lever plan and a name(s) of a lower level plan(s), if a plan has such. The hierarchy information may also contain some other information, like a type of a plan, its purpose, etc. The hierarchy information may also be used to keep track of shared tracking information, for example by storing information on users, what they have loaded, the last loaded data item, the last stored data item, etc. Further, the hierarchy information, or part of it, may be visible or non-visible to users, or to some users. It should be appreciated that hierarchy information is additional information and embodiments may be implemented without such hierarchy information.

Below, the term "shared plan" means a plan stored in the data repository for the model, and "shared model" means the modeling entity formed by all shared plans belonging to one model. It should be appreciated that the data repository may comprise several shared models, although only one is illustrated in FIG. 1. Further, it should be appreciated that herein it is assumed, for the sake of clarity, that all users see the same shared model and are allowed to use the same model and a logical memory structure in which there is a local memory and a shared memory, without restricting the examples and implementations to such a solution.

The apparatus 120 may be any computing apparatus with which shared data can be accessed, created, obtained/retrieved/downloaded, modified, deleted, updated and/or published. Examples of apparatuses include a user terminal or work station, such as a laptop, a smartphone, a personal computer, a tablet computer, a field device, an e-reading device, a printer with processing capabilities, or a personal digital assistant (PDA).

The apparatus 120 is configured to perform one or more functionalities described below with an embodiment, and it may be configured to perform functionalities from different embodiments. For this purpose, the apparatus 120 comprises a plan managing unit (PMU) 125, and at least one memory 121 for storing a working version (a working copy) of each of one or more plans the user has selected to create or modify or view, for example as a "run-time database".

In the illustrated example, the user has selected to modify the plan Bb1 and therefore the memory comprises a local version 122 of the plan Bb1, the local version comprising a snapshot 123 of the plan Bb1. The snapshot comprises copies of data items belonging to the plan Bb1 in the data repository up to and including the data item the user has selected but not those after the selected data item, as will be described in more detail later. The local version 122 further comprises tracking information 124 for the plan, the tracking information being described in more detail with FIG. 3. Naturally, the local version comprises modifications the user has made to the loaded plan, but they are not illustrated in FIG. 1.

Although the memory 121 is illustrated as a memory separate from the memory in the server, it should be appreciated that the memory may be located anywhere; it will suffice that it is the memory comprising a working copy and used by the client, or at the plan managing unit (PMU) 125 as the memory 121.

The apparatus 120, or a corresponding component, is a computing device comprising not only prior art means, but also means for implementing a plan managing unit functionality described with an embodiment, and it may comprise separate means for each separate function, or means may be configured to perform two or more functions, and even to combine functions of different embodiments. These means may be implemented by various techniques. For example, the means may be implemented by hardware (one or more apparatuses), firmware (one or more apparatuses), software (one or more modules), or combinations thereof. For firmware or software, implementation can be through units/modules (e.g. procedures, functions, and so on) that perform the functions described herein.

The apparatus also comprises different interface units, like a user interface by means of which a user can create data, modify and/or update data, study it, print data (such as drawings or reports), etc. In addition, the apparatus may comprise a separate interface unit including a transmitter and/or a receiver or a corresponding means for receiving and/or transmitting information.

Each of the units may be a separate unit or integrated into another unit, or the units may be integrated together. It should be appreciated that the apparatus may comprise other units used in or for data processing, like a change management unit(s). However, they are irrelevant to the actual invention and, therefore, they need not be discussed in more detail here.

The apparatus and corresponding components implementing a functionality or some functionalities according to an embodiment may generally include a processor (not shown in FIG. 1), controller, control unit, micro-controller, or the like connected to a memory and to various interfaces of the apparatus. Generally the processor is a central processing unit, but the processor may be an additional operation processor. The plan managing unit 125 may be configured as a computer or a processor, or a microprocessor, such as a single-chip computer element, or as a chipset, including at least a memory for providing storage area used for arithmetic operation and an operation processor for executing the arithmetic operation. The plan managing unit 125 may comprise one or more computer processors, application-specific integrated circuits (ASIC), digital signal processors (DSP), digital signal processing devices (DSPD), programmable logic devices (PLD), field-programmable gate arrays (FPGA), and/or other hardware components that have been programmed to carry out one or more functions of one or more embodiments. An embodiment provides a computer program embodied on any client-readable distribution/data storage medium or memory unit(s) or article(s) of manufacture, comprising program instructions executable by one or more processors/computers, which instructions, when loaded into an apparatus, constitute the plan managing unit 125. Programs, also called program products, including software routines, program snippets constituting "program libraries", applets and macros, can be stored in any medium and may be downloaded into an apparatus. The data storage medium or the memory unit may be implemented within the processor/computer or external to the processor/computer, in which case it can be communicatively coupled to the processor/computer via various means, as is known in the art.

As said above, the client includes memory 121 for acting as a "run-time database", for example. The memory may be volatile and/or non-volatile memory and it may also store other data. For example, the memory may store a computer program code such as software applications (for example, for the editing unit or the data publishing unit) or operating systems, information, data, content, or the like for the processor to perform steps associated with operation of the client in accordance with embodiments. The memory may be, for example, a random access memory, a double floating-gate field effect transistor, a hard drive, another fixed data memory or storage device or any combination thereof. Further, the memory, or part of it, may be a removable memory detachably connected to the client.

Although the apparatus has been depicted as one unity, different processors, controllers, interfaces and/or memory/memories may be implemented in one or more physical or logical units.

Below, different examples are described assuming that the data items stored in the data repository are identified by means of globally unique identifiers (GUIDs) without restricting the examples to such an identification method. A GUID is a special type of identifier known by one skilled in the art and used in software applications to provide a unique reference number or reference time.

FIG. 2 illustrates an example of relationship information 200 that a data item stored in the data repository (i.e. in a shared plan) may contain. The data item A3 in plan A illustrated in FIG. 1 is used as an example. The relationship information 200 comprises a GUID 201 identifying the data item in question. The relationship information 200 further comprises information on a previous data item 202 and on a next data item 203 and information on a higher level relationship (hlr) 204 and higher level action performed (hlr-act) 205. If the value field of the next data item 203 indicates no association with another data item, for example is empty or has "no", this implies that the data item is the last one stored to this plan. If the value field of the previous data item 202 is empty or has "no", this implies in the example that the data item is the first one that is specific in this plan. In the example, the value field of the higher level relationship 204 either contains a GUID identifying the higher level data item or is empty/has "no", and the value field of the higher level action 205 contains information on the performed action for which the relationship was used with this data item or is empty/has "no". In some other examples, the value field of the previous data item 202 may contain the GUID identifying the higher level data item and the higher level relationship 204 contains the (last) performed action, or the fields 204 and 205 are combined so that the value field is either empty/has "no" or contains the GUID identifying the higher level data item and information on the last performed action. Examples of actions are described in more detail with FIG. 4.

Other examples of the content(s) of the packet relationship information using the plans illustrated in FIG. 1 include:
  data item A1 contains its GUID A1, the value field of the previous data item is empty, the value field of the next data item is associated with A2, and the value field of the higher level relationship contains M2 and "load",
  data item D2 contains its GUID D2, the value field of the previous data item contains D1 and the value field of the next data item has no association, and the higher level data item relationship information contains M3 and "save to higher",
  data item A5 contains its GUID A5, the value field of the previous data item is A4, and the value fields of the next data item and the higher level relationships are empty.

In one implementation, the packet relationship may further comprise a field "plan GUID", the value of which contains a start packet of the plan, and hereby indicates the name and/or other identification information on the plan.

It should be appreciated that instead of, or in addition to, the higher level data item relationship, a lower level data item relationship may be used to indicate the hierarchy.

As is evident from the above, the plan hierarchy may be formed by merely using the relationship information, since by means of the relationship information each data item indicates to other data items how it connects to the hierarchy.

Figure 3:
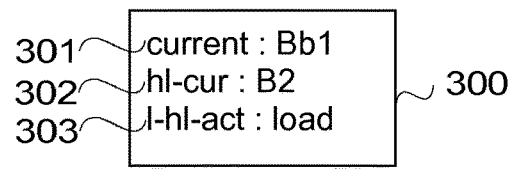
FIG. 3 illustrates tracking information.

FIG. 3 illustrates tracking information 300 maintained client-specifically for a local version of a plan. Typically it is maintained in a run-time database of the client and by the client. However, it should be appreciated that the tracking information may be maintained anywhere where the client may access it, and by an entity other than the client, for example by a server. The illustrated imaginary phase in FIG. 1 is used as an example. The tracking information 300 comprises at least a field herein called a current 301, and in the illustrated example it further comprises following auxiliary fields: higher level current (hl-cur) 302, and last higher level action (l-hl-act) 303. The value field of the current 301 contains the GUID identifying the data item which is the last one loaded to or saved from the local memory from the shared plan in the local version of the plan. The value field for the higher level current 302 contains the GUID identifying a data item in a higher level shared plan of the shared plan, which data item is the last higher level data item referred to by a data item in the shared plan at the point of the snapshot, and the value field for the last higher level action 303 indicates the last performed action between the shared plan and the higher level shared plan. The value fields for the higher level current 302 and the last higher level action 303 may be empty if the plan loaded to the local memory is the master plan. Further, instead of having the auxiliary fields, corresponding information may be obtained by searching reference information stored in the shared plan starting from the data item referred to by the GUID.

Figure 4:
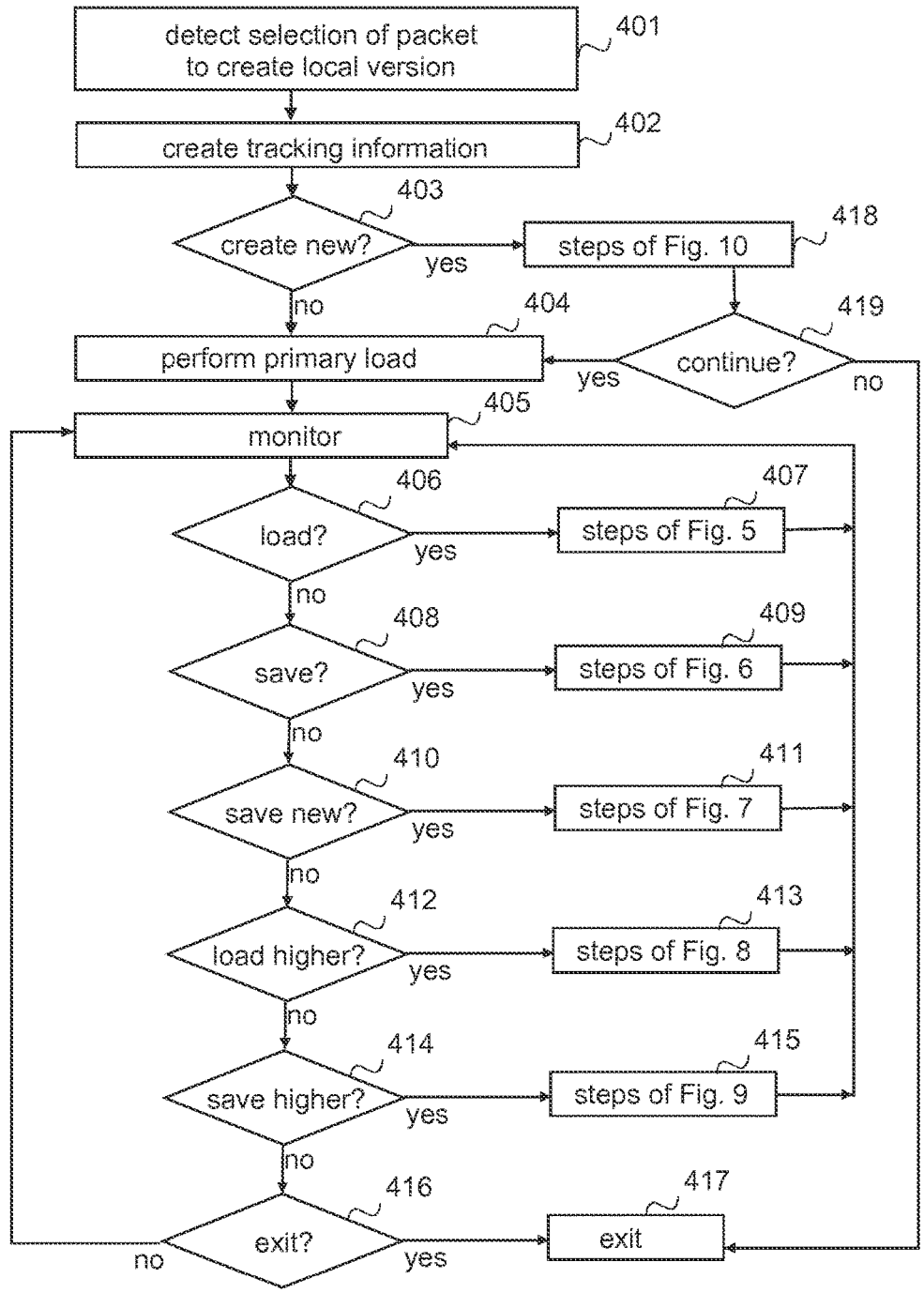

Other examples of the content(s) of the exemplary tracking information using the plans illustrated in FIG. 1 include:
  for a snapshot taken from data item C1 in plan C:
    current: C1
    higher level current: A3
    higher level action: load
  for a snapshot taken from data item A5 in plan A:
    current: A1
    higher level current: M2
    higher level action: load
  for a snapshot taken from data item D2 in plan D:
    current: D2
    higher level current: M3
    higher level action: save FIG. 4 is a flow chart illustrating a functionality of an apparatus, or more precisely, a plan managing unit according to an exemplary embodiment. In the illustrated examples, following assumptions are made for the sake of clarity, without restricting solutions to such assumptions:
  a packet is used as an example of a data item;
  a packet contains only modifications (changes);
  a plan starts with an empty packet having only relationship information, below called packet relationship information, other packets contain changes as contents; and
  loading from or saving in the shared plan or higher level shared plan will succeed.

Although following examples are described using shared data in which only changes are published (stored), the change management, including conflict handling, is not described in detail herein. Any change management may be used.

An example of change management that may be used is based on a principle of causality and dualistic sequence information. The principle of causality is the relationship between a cause and an effect, where the effect is a consequence of the cause and happens after the cause. The dualistic sequence information includes an unambiguous sequence and information indicating a possible internal (local) deviation from the unambiguous sequence, and it is also stored in the shared data. The dualistic sequence, created with (during, by) creating, editing, updating etc. the model locally, indicates that there may be a local deviation from a global sequence by means of the deviation information, and therefore the deviation is detectable later. In the concept, if during processing of a local copy of the shared data, a change to the shared data is published by another user and when the change is loaded to the local copy, a local deviation is created, and when the result of the processing (i.e. unpublished changes) is published, it is associated with an unambiguous sequence reference and the local deviation. The change management is described in more detail in Finnish patent application 20125270, corresponding EP application no. 12 159 577.1, and corresponding U.S. patent application Ser. No. 13/421,896, assigned to the applicant, which are hereby incorporated by reference. Further, the principle of causality and the dualistic sequence information are also implemented in Tekla® Structures release 17.1, released in October 2011. It should be appreciated that the dualistic sequence information, with or without the causality principle, may also be used for conflict management detected when data items are loaded from the shared plan or from the higher level shared plan. Further, it should be appreciated that the details of updating a snapshot of a plan and related actions are known by one skilled in the art, and therefore they are not described herein.

One way to ensure that the saving will succeed is to use an atomic transaction that ensures that all that is supposed to be stored in a shared plan or in a higher level shared plan, like a packet with corresponding relationship information, below called packet relationship information, or two or more packets with the information, are stored in the data repository or none of them. However, any other means may be used.

Further, instead of saving almost immediately after a start packet is formed the start packet as an empty packet in the shared plan, the start packet may be stored later (at a later stage) and with actual contents. A modification of this kind to the examples described herein is straightforward to one skilled in the art, and therefore it is not described in detail herein.

Referring to FIG. 4, it is detected, in step 401, that the user has selected a certain packet in a shared model, i.e. a packet in one of one or more plans in the data repository, to be loaded to the local memory to create a local version of the plan. The plan may be any plan, and the user may select any packet belonging to the plan, i.e. the packet may be the newest one or an older one. Because of the selection, tracking information is created in step 402. When the tracking information is created, a value field of the current is set to be the GUID of the packet the user selected, and the value fields relating to the higher level are set according to the situation of the packet the user selected (see above).

Then it is checked, in step 403, whether the user selected an action "create a new plan". If the user did not select "create a new plan" (step 403), a primary load is performed in step 404. The primary load means that packets that represent the plan at the selected point are loaded (i.e. copied) to the local memory, and a snapshot is created. For example, the snapshot in FIG. 1 illustrates which packets are loaded to the local memory when the user has selected the packet Bb1 in the plan B. Another example for a snapshot is that the plan A has the packets A1 to A5 and a user wants to create the plan C that comprises the packets A1 to A3 from the plan A. When the user takes a snapshot from the packet A3, the packets A4 and A5 are not loaded in the primary load to be part of the plan C.

Then the modeling is monitored in step 405, and in the illustrated example the plan managing unit is configured to react to certain user inputs, i.e. actions (or commands). In the illustrated example, the actions are "load", "save", "save as a new plan", "load from higher level", "save to higher level" and "exit". The action "load" means that updates to the shared plan, a copy of which is processed, are obtained. The action "save" means that the modifications made to the snapshot are to be saved in the shared plan. The action "save as a new plan" means that the modifications to the snapshot are not to be saved in the shared plan, although that was the intention earlier (and the reason why "create new" was not selected in the beginning). The action "load higher level" means that updates to the higher level shared plan are obtained. The action "save to higher level" means that the modifications made to the snapshot, as well as modifications in the plan not yet saved in the higher level plan are to be saved in the higher level shared plan. The actions "save", "load", "save to higher level", "load from higher level" may be interpreted as hierarchy rules according to which modeling data may be loaded from a master plan to other plans in the hierarchical structure, and modeling data saved in the master plan from the other plans in the hierarchical structure.

Figure 5:
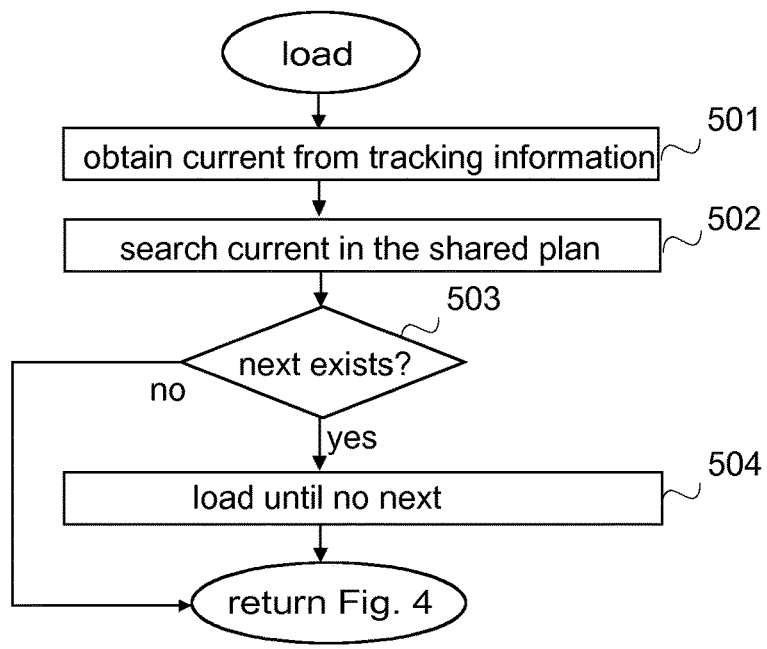
FIGS. 4 to 14 are flow charts illustrating different exemplary functionalities.

If action "load" is detected (step 406), the steps of FIG. 5 are performed in step 407, and the monitoring is continued (step 405).

Figure 6:
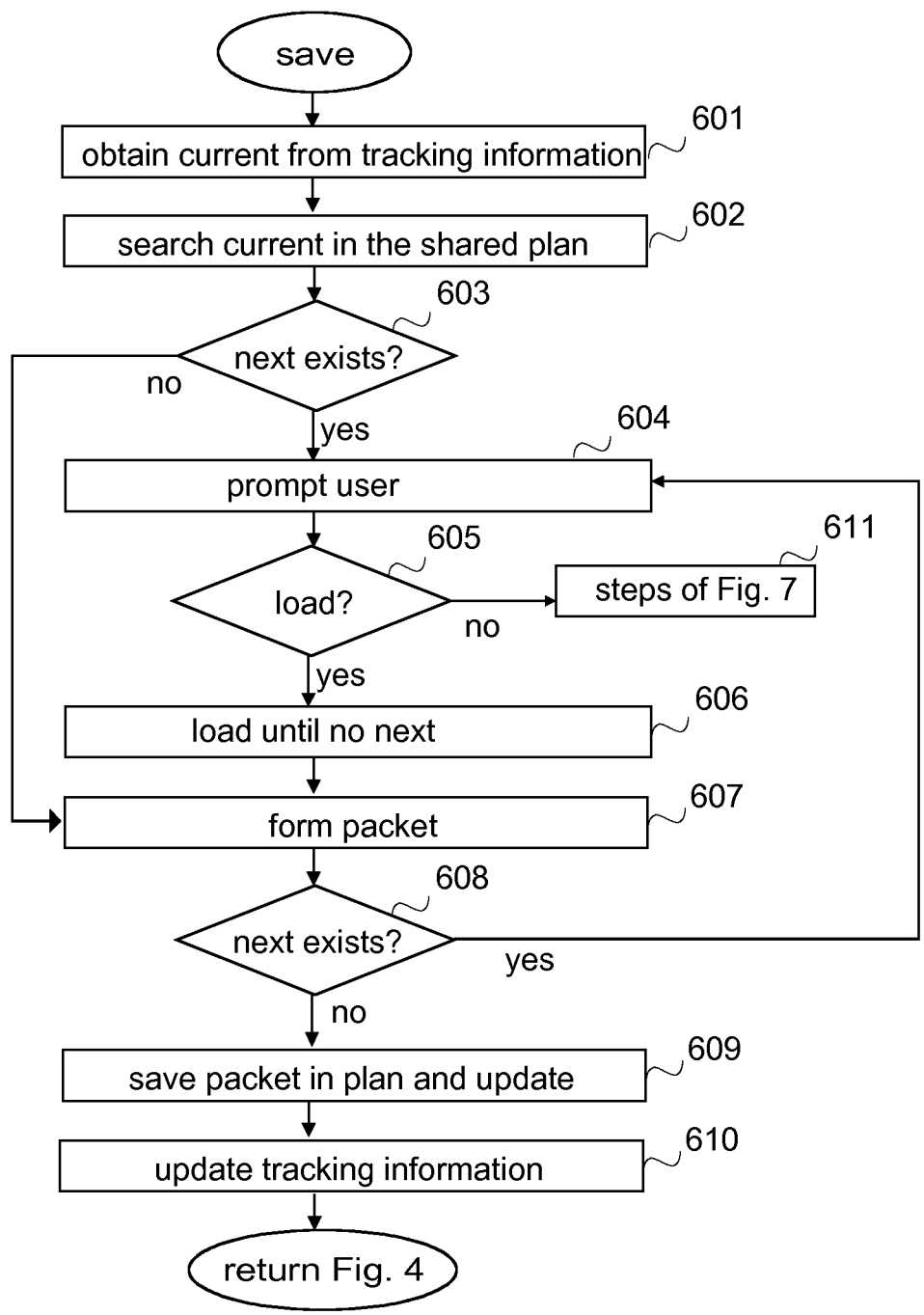

If action "save" is detected (step 408), the steps of FIG. 6 are performed in step 409, and the monitoring is continued (step 405).

Figure 7:
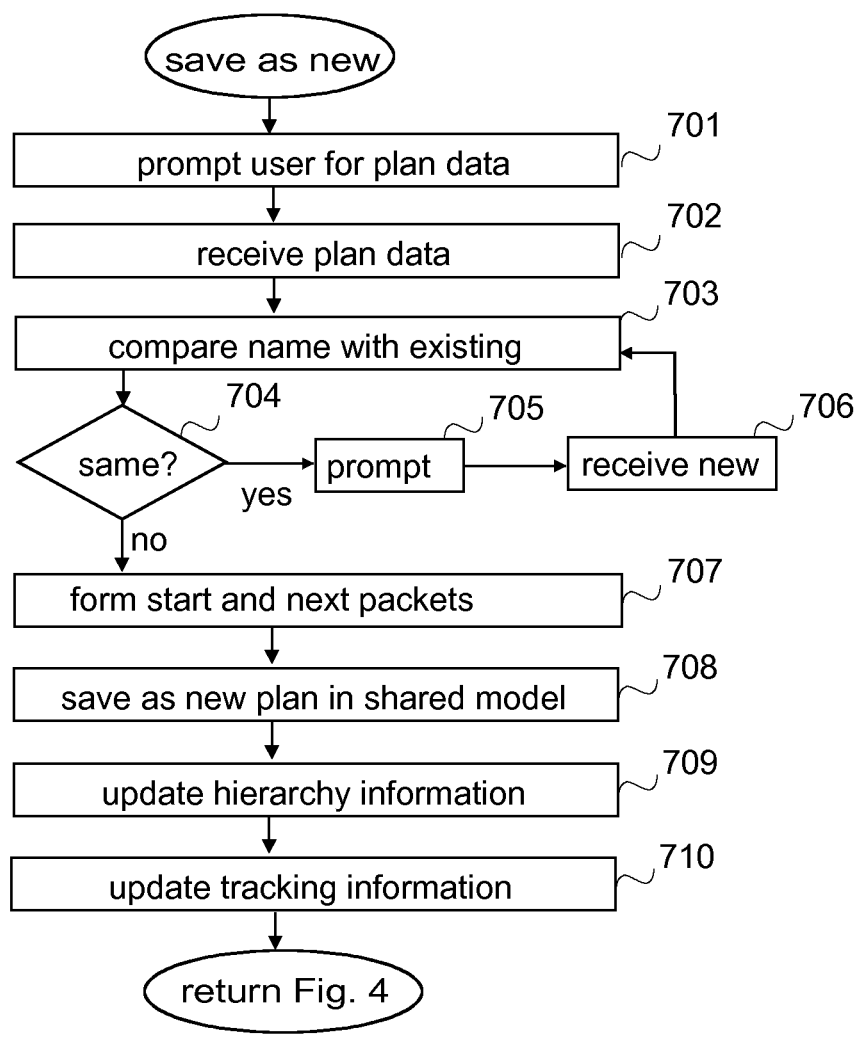

If action "save as a new plan" is detected (step 410), the steps of FIG. 7 are performed in step 411, and the monitoring is continued (step 405).

If action "load from higher level" is detected (step 412), the steps of FIG. 7 are performed in step 413, and the monitoring is continued (step 405).

Figure 8:
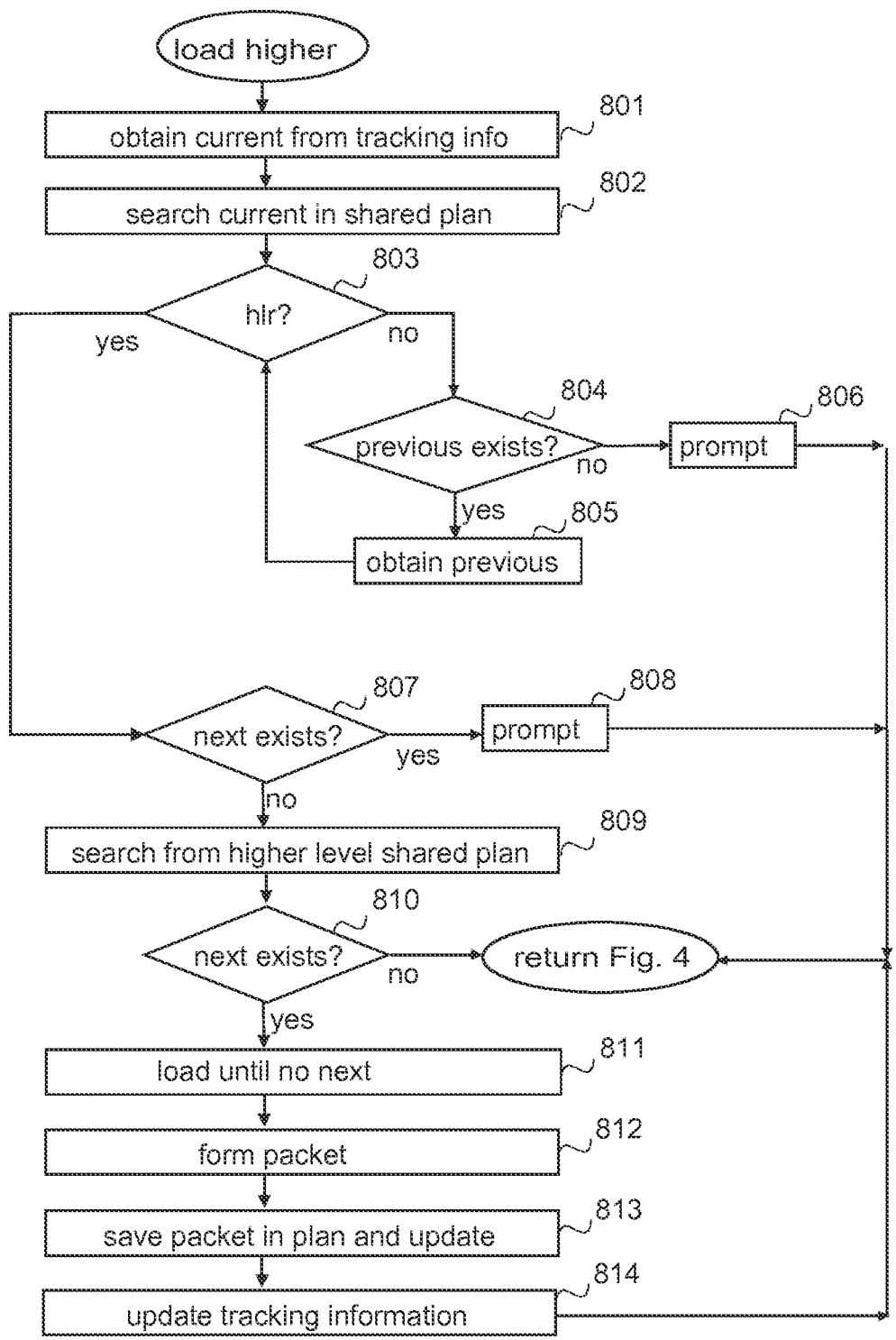

If action "save to higher level" is detected (step 414), the steps of FIG. 8 are performed in step 415, and the monitoring is continued (step 405).

If action "exit" is detected (step 416), the process exits in step 417. In one implementation, the process may check before exiting whether the previous action related to a save action, i.e. whether it was "save" in step 408 or "save as a new plan" in step 410 or "save to higher level" in step 414, and if the previous action did not relate to the save action, the process exits by storing the modifications and other information in the local memory, and when the user continues with the plan, the local copy is processed as if it had not been stored, at least from the point of view of the shared plan.

Figure 10:
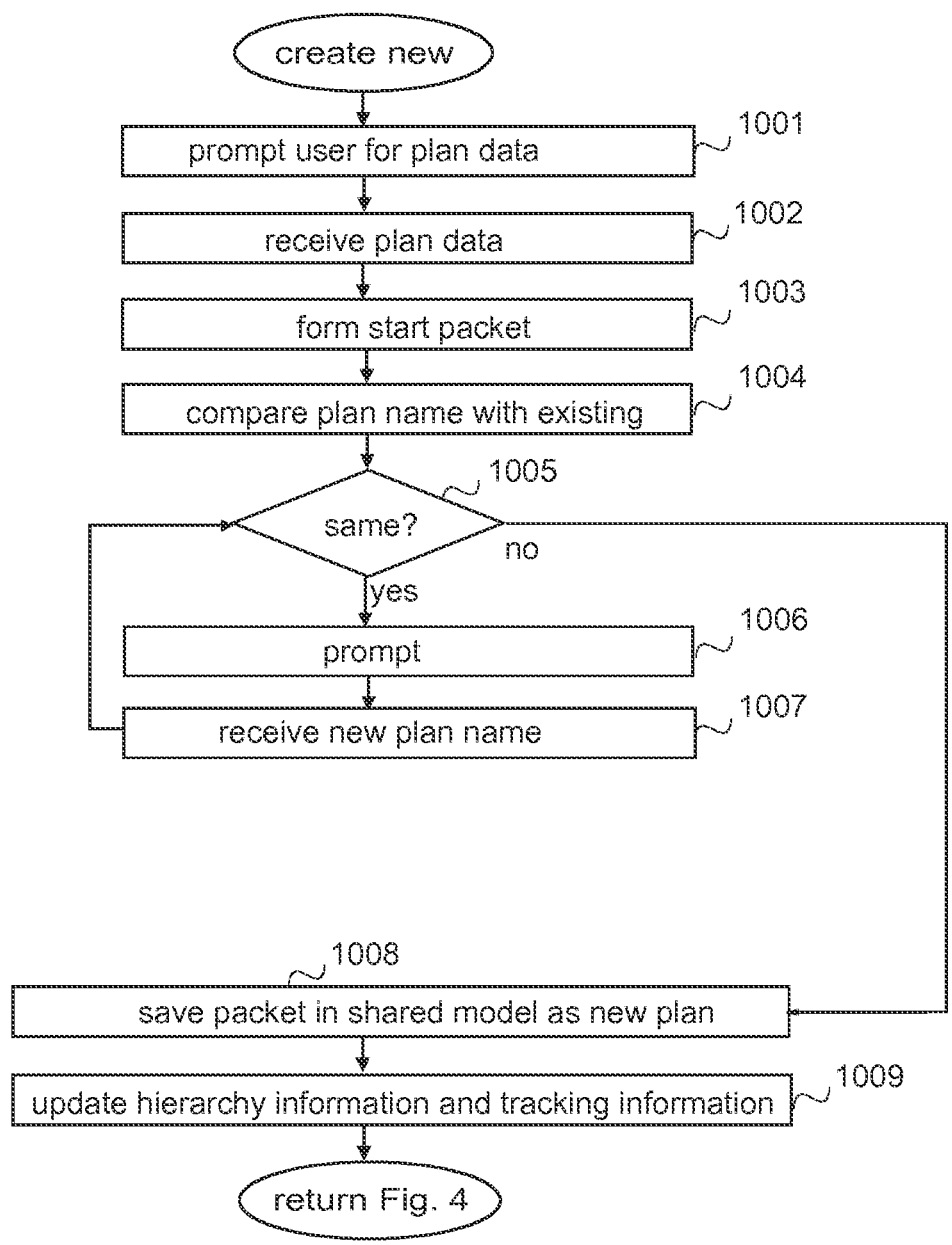

If action "create new" is detected (step 403), the steps of FIG. 10 are performed in step 418, and then it is checked whether or not the user continues (step 419) to edit the model. If the user continues, the process proceeds to step 404 to perform the primary load, otherwise the process exists (step 417).

It should be appreciated that although in the illustrated example the primary load is performed automatically, this need not be the case; the primary load may be provided as a separate action or when an action "load" is performed for the first time for the plan.

FIG. 5 illustrates an example of steps performed in response to "load" action.

When the user has selected "load", the GUID of the current is obtained from the tracking information in step 501, and a packet having the GUID is searched for in step 502 from the shared plan. In the illustrated example it is assumed that such a packet is found. Then it is checked in step 503 from the packet relationship information of the found packet whether or not the value field of the next packet indicates that a next packet exists. If the value field is associated with a GUID, the next packet(s) is/are loaded in step 504 as long as there are next packets to be loaded. In other words, the packet last loaded is a packet whose value field of the next packet is not associated with a GUID. Then the value field of current in the tracking information is updated to be the GUID of the packet last loaded. Then the process returns to FIG. 4.

If in step 503 it is detected that there exists no next packet, there are no new packets to be loaded and the process returns to FIG. 4.

It should be appreciated that after a packet has been loaded to the local copy, or after loading of packets ends, the packet(s) may undergo a change management/conflict handling procedure, for example the change management based on the principle of causality and dualistic sequence information described above. However that need not be described in more detail here.

FIG. 6 illustrates an example of steps performed in response to "save" action.

When the user has selected "save", the GUID of the current is obtained from the tracking information in step 601, and a packet in the corresponding plan in the data repository, i.e. the shared plan, having the GUID of the current is searched for in step 602. In the illustrated example it is assumed that such a packet is found. Then it is checked in step 603 from the packet relationship information of the found packet, whether or not the value field of the next packet indicates that a next packet exists.

If the value field of the next packet is associated with a GUID (step 603), in the illustrated example the user is prompted in step 604 whether to load one or more packets and perform the save or to create a new plan. If the user selects to load (step 604), the next packet(s) is/are loaded in step 606 as long as there are next packets to be loaded. In other words, the packet last loaded is a packet whose value field of the next packet is not associated with a GUID.

After the packets are loaded, or if the value field of next packet is not associated with a GUID, a new GUID is obtained and a new packet is formed in step 607, the packet containing modifications made to the plan after the packet indicated by the value field of the current (so called "current packet") was formed, including loaded information and information that may have been stored locally in a local packet formed later than the "current packet". The packet relationship information of the packet formed in step 607 contains as the previous packet the GUID of the last loaded packet. It should be appreciated that the actual content of the packet, i.e. information other than the packet relationship information described with FIG. 2, is typically determined/formed by an editing unit and/or a change managing unit, rather than by the packet managing unit, without restricting the example to such a solution.

When the packet is ready, it is checked in step 608 from the packet relationship information of the last loaded packet, whether or not the value field of the next packet indicates that a next packet exists. In other words, it is checked whether or not during the packet forming one or more packets have been stored in the shared plan. If the value field of the next packet is associated with a GUID (step 608), the process proceeds back to step 604 to prompt the user.

If the value field of the next packet is empty (step 608), the packet formed in step 607 is saved in step 609 in the shared plan in the data repository, and the packet relationship information of the last loaded packet in step 606 is updated so that the value field of next packet is associated with the GUID of the formed and saved packet. The tracking information is updated in step 610 to have the GUID of the formed and saved packet as the value of the current, and the process returns to FIG. 4.

If the user selected not to load (step 605), the process proceeds to FIG. 7 to perform the "save as a new plan" action.

In another example, the process may create in step 611 the plan data, and after that proceed directly to step 707 in FIG. 7. The created plan data comprises as a name for the plan the name of the "original" plan added with temporary and creation time, like temporary-A-dd-mm-yy-hh-mm, an indication that it is a parallel plan, and possible additional information, like the purpose of this version (temporary).

In a still further example, if the value field of the next packet is associated with a GUID (step 603 or step 608), the process is configured to automatically create a new plan instead of loading. In the example, after step 603 or after step 608 the process proceeds either to step 607 or to step 611.

In a yet another example, the process is configured to automatically create a new plan instead of loading only after the packet has been formed and the value field of the next packet is associated with a GUID (step 608), i.e. steps 604, 605, 606 and 607 are not omitted after step 603.

In an implementation in which the shared memory is locked to be used by the client when the packet indicated as current is found (step 602) or just before the loading starts, steps 604, 605, 608 and 611 may be omitted. Alternatively, only step 608 may be omitted thereby allowing the user to determine whether or not to perform the load.

FIG. 7 illustrates an example of steps performed in response to "save as a new plan" action.

When the user has selected "save as a new plan", the user is prompted for plan data in step 701, and the plan data is received in step 702. Then the name of the plan is compared, in step 703, with the names in a hierarchy information table in the data repository to minimize a danger of confusion with several users sharing the model, or part of the model. If the intended name is the same as a name already used (step 704), the user is prompted in step 705 to input a new name. When the new name is received in step 706, the process continues to step 703 to compare the new name with the names in the hierarchy information.

When the name is not a previously used name, a start packet for the plan is formed in step 707 and, in the illustrated example, also a next packet for the plan. It should be appreciated that if the "save as a new plan" functionality is triggered from the "save" action described above with FIG. 7, and a packet has been already formed, there is no need to form the same packet once again, the already formed packet may be used as the next packet or its content as a content in the start packet. The packet relationship information of the start packet contains in the value field of the previous packet no information or "none" and the value field of the next packet has no association; the GUID of the selected packet used for snapshot in step 401 in FIG. 4 is added to the field value of the higher level relationship, and "load" is added to the value field of the higher level action. Further, two new GUIDs are obtained in step 707, one for the start packet and the other for the next packet. The value field of the next packet in the packet relationship information of the start packet is associated with the GUID of the next packet. The packet relationship information of the next packet contains in the field value of the previous packet the GUID of the start packet, the other field values are empty. Further, content is added to the next packet, so that modifications made to the plan after primary load are included into the next packet and, depending on an implementation, also the information obtained during primary load may or may not be included in the packet.

Then the packets are saved in step 708 to be a new shared plan of the shared model in the data repository, and the hierarchy information is updated in step 709 to contain required information on the new plan, such as the name of this new plan, the name of the higher level plan of this new plan, adding this new plan as a new lower level plan to the higher level plan, etc. Further, tracking information is updated in step 710 to be the tracking information for this new plan. During the update in step 710, the GUID in the current field is moved to the value field of the higher level current, and the GUID obtained in step 707 for the next packet is set to be the value of the current, and the last higher level action is set to be the load. Then the process returns to FIG. 4, and continues monitoring this new plan.

FIG. 8 illustrates an example of steps performed in response to "load from higher level plan" action.

When the user has selected "load from higher level plan", the GUID of the current is obtained from the tracking information in step 801, and a packet having the GUID is searched for in step 802 from the shared plan. In the illustrated example, it is assumed that such a packet is found. Then it is checked, in step 803, from the packet relationship information of the packet found in the shared plan whether the value field of the higher level relation contains a GUID or is "no" (or empty). If the packet has no higher level relation (i.e. the value field of higher level relations is empty or "no"), it is checked in step 804 from the packet relationship information of the packet found in step 802 in the shared plan whether or not the value field of the previous packet indicates that a previous packet exists in the shared plan. If the value field contains a GUID, there is a previous packet in the shared plan and packet relationship information of the previous packet in the shared plan is obtained in step 805 and the process proceeds to step 803 to check the higher level relationship of the previous packet.

If in step 804 it is detected that no previous packet exists in the shared plan, there is no higher level plan and the user is prompted in step 806 that the action failed and/or that the snapshot is from the master plan, and the process then returns to FIG. 4.

If the value field of the higher level relationship contains a GUID (step 803), herein called a hlr-GUID, there is a higher level relationship. it is checked, in step 807, from the packet relationship information of the packet in the shared plan having a GUID corresponding to the current GUID in the tracking information, i.e. from the packet found in step 802, whether or not the value field of the next packet indicates that a next packet exists in the shared plan.

If the value field of the next packet is associated with a GUID (step 807), it indicates that the shared plan has one or more updates that need to be taken into account before loading from the higher level plan. Therefore the user is prompted in step 808 to perform "load" and only after that to try "load from the higher level". By loading first from the shared plan, and after that loading from the higher level shared plan, facilitates maintaining plan hierarchy and change management, for example. Then the process proceeds to FIG. 4. In another implementation, the steps of FIG. 5 may be performed in step 808 and then the process continues to step 809.

If the value field of next packet is not associated with a GUID (step 807), it indicates that there are no updates in the shared plan that needs to be taken into account before loading from the higher level plan. Therefore loading from the higher level plan is started in step 809 by searching in the higher level shared plan for a packet having the hlr-GUID. In the illustrated example it is assumed that such a packet is found. Then it is checked in step 810 from the packet relationship information of the packet found in the higher level shared plan whether or not the value field of the next packet indicates that a next packet exist. If the value field is associated with a GUID, the next packet(s) in the higher level shared plan is/are loaded in step 811, as long as there are in the higher level shared plan next packets to be loaded. In other words, the packet last loaded from the higher level shared plan is a packet whose value field of the next packet is not associated with a GUID. For example, if a user has taken a snapshot from packet C1 in FIG. 1, packets A4 and A5 are loaded.

Then an update packet for the shared plan is formed in step 812. The packet relationship information of the update packet contains in the field value of the previous packet GUID which is still indicated as the current in the tracking information (and which was used in step 802), the next packet has no association or "none" or "no", the GUID of the last packet loaded in step 811 is added to the field value of the higher level relationship, and "load" is added to the value field of the higher level action. Further, a new GUID is obtained in step 812 and content is added to the packet, the content containing at least changes caused by the loaded higher level information.

Then the packet is saved in step 813 in the shared plan in the data repository, and the packet relationship information of the packet found in step 802 is updated so that the value field of next packet is associated with the new GUID of the formed and saved packet. The tracking information is updated in step 814 to have the new GUID of the packet saved in step 813 in the shared plan as the value of the current, the higher level relationship is set to have the GUID of the packet last loaded in step 811 from the higher level shared plan, and the last higher level action is set to load. Then the process returns to FIG. 4.

In another implementation, steps 811 to 814 are performed packet by packet, for example first on packet A4 and then on packet A5 so that there will be two new packets in the shared plan C.

If in step 810 it is detected that no next packet exists, there are no new packets to be loaded from the higher level plan, and the process returns to FIG. 4.

It should be appreciated that after a packet has been loaded to the local copy, or after loading of packets ends, the packet(s) may undergo a change management/conflict handling procedure, for example the change management based on the principle of causality and dualistic sequence information described above. However that need not be described in more detail here.

Figure 9:
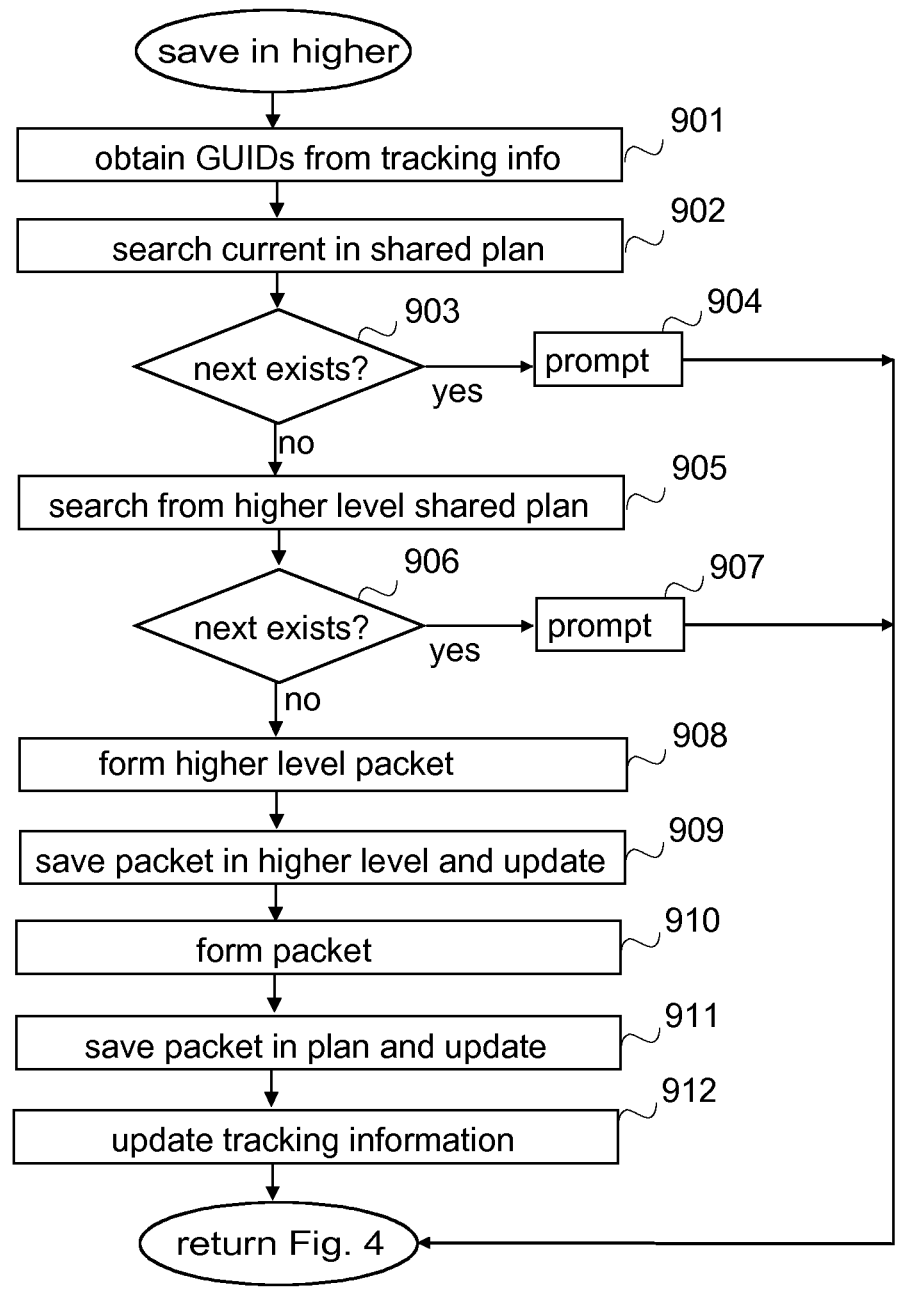

FIG. 9 illustrates an example of steps performed in response to "save to higher level plan" action.

When the user has selected "save to higher level plan", the GUIDs of the current (c-GUID) and the higher level relationship (hl-GUID) are obtained in step 901 from the tracking information. Then the current packet is searched for from the shared plan in step 902. In the illustrated example, it is assumed that such a packet is found. Then it is checked in step 903 from the packet relationship information of the found current packet whether or not the value field of the next packet indicates that a next packet exists.

If the value field of the next packet is associated with a GUID (step 903), there are updates in the shared plan that have not been taken into account and the user is prompted in step 904 to perform "load" before "save to higher level plan" can be performed. Then the process returns to FIG. 4.

If the value field of the next packet is not associated with a GUID (step 903), a packet having an hl-GUID is searched for from the higher level shared plan in step 905. In the illustrated example, it is assumed that such a packet is found. Then it is checked in step 906 from the packet relationship information of the found higher level packet, whether or not the value field of the next packet indicates that a next packet exists.

If the value field of the next packet is associated with a GUID (step 906), there are updates to the higher level plan in the shared data that have not been taken into account and the user is prompted in step 907 to perform "load from higher level" before "save to higher level plan" can be performed. Then the process returns to FIG. 4.

If the value field of the next packet in the higher level packet is also not associated with a GUID (step 906), there are no updates that need to be taken into account. Then a new GUID is obtained and a new packet for the higher level plan is formed in step 908, the packet containing modifications made to the plan after the packet indicated by the value field of the higher level packet (so called "higher level packet") was formed, including loaded information and information that may have been stored locally in a local packet formed later than the "higher level packet", and/or saved in the shared plan later than the "higher level packet". The packet relationship information of the packet formed in step 908 contains as the previous packet the GUID of the previous higher level packet (hl-GUID). Then the packet is saved in step 909 in the higher level shared plan in the data repository and the packet relationship information of the previous higher level packet is updated in step 909 so that the value field of the next packet is associated with a GUID (new GUID) of the saved packet.

Then another new GUID ("another new GUID") is obtained and a new packet for the plan is formed in step 910, the packet containing modifications made to the shared plan after the packet indicated by the value field of the current packet (so called "current packet") was formed, including loaded information and information that may have been stored locally in a local packet formed later than the "current packet". The packet relationship information of the packet formed in step 910 contains as the previous packet the GUID of the previous "current packet" (c-GUID), as a higher level relationship the GUID (new GUID) obtained in step 908 for the packet formed in step 908 and as a higher level action "save". Then the packet is saved in step 911 in the shared plan in the data repository, and the packet relationship information of the previous packet is updated in step 909 so that the value field of the next packet is associated with the GUID of the saved packet (another new GUID). Then the tracking information is updated in step 912 correspondingly, i.e. the value field of the current is set to "another new GUID", the value field of the higher level relationship is set to "new GUID", and the last higher level action is set to "save". Then the process returns to FIG. 4.

Although in the above steps 909 and 911 are described as separate saving steps, it should be appreciated that the steps are preferably but not necessarily performed using the atomic transaction principles.

FIG. 10 illustrates an example of steps performed in response to "create new" action.

When the user has selected "create new", the user is prompted, in step 1001, to provide plan data, such as a name for the plan and possible additional information, like the purpose of this version, and whether it is intended to be an alternative, and if yes, preferably information identifying another/other alternative plan(s). The plan data is received in step 1002 and a start packet for the plan is formed in step 1003. For the start packet a new GUID is obtained in step 1003, and also other packet relationship information is set. The packet relationship information of the start packet contains in the value field of the previous packet no information or "none", the value field of the next packet has no association, the GUID of the selected packet used for snapshot in step 401 in FIG. 4 is added to the field value of the higher level relationship, and no information or "none" is added to the value field of the higher level action.

Then the name of the plan is compared in step 1004 with the names in the hierarchy information of the shared model in the data repository to minimize a danger of confusion with several users sharing the model, or part of the model. If the intended name is the same as a name already used (step 1005), the user is prompted in step 1006 to input (enter) a new name. When the new name is received in step 1007, the process continues to step 1004 to compare the new name with the names in the hierarchy information.

When the name is not a previously used name, the start packet is saved in step 1008 to be a new shared plan in the shared model data repository, and the hierarchy information of the shared model is updated in step 1009 to contain required information on the new plan, such as the name of this new plan, the name of the higher level plan of this new plan, adding this new plan as a new lower level plan to the higher level plan, etc. In one implementation, the start packet comprises the plan name. Further, tracking information is updated in step 1009 to have the new GUID obtained in step 1003 for the start packet as the value of the current, and the process returns to FIG. 4.

Although in the above it is assumed that the actions "save to higher level", and "load from higher level" store the changes also in the shared plan below the shared higher level plan, it should be appreciated that instead of changes, a reference to a packet in the higher level containing the changes is stored in the shared plan. Yet another possibility is to store, in addition to the changes, also the full (prevailing) state of the shared model at the time of the storing. This can be applied to any "save" or "load", and an implementation may mix these different possibilities.

Figure 11:
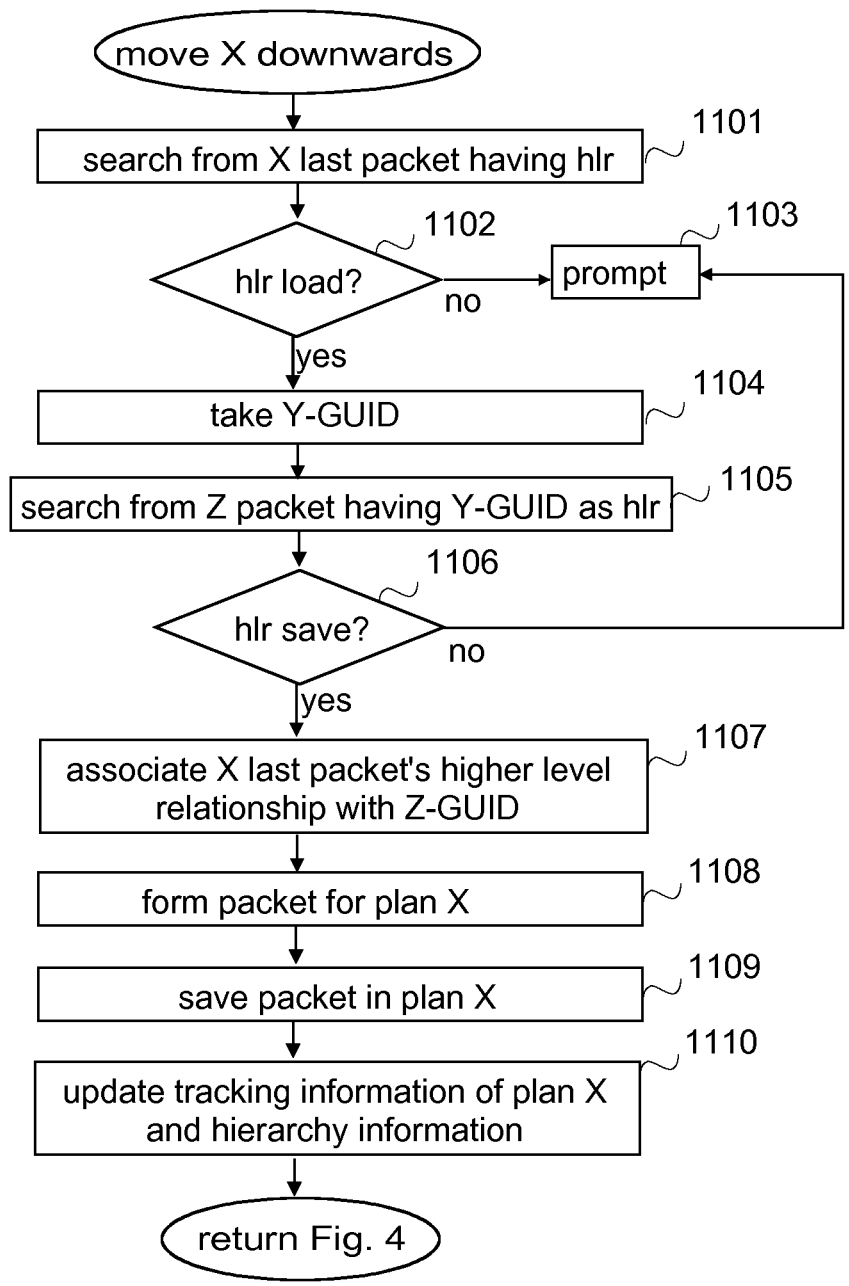
Figure 12:
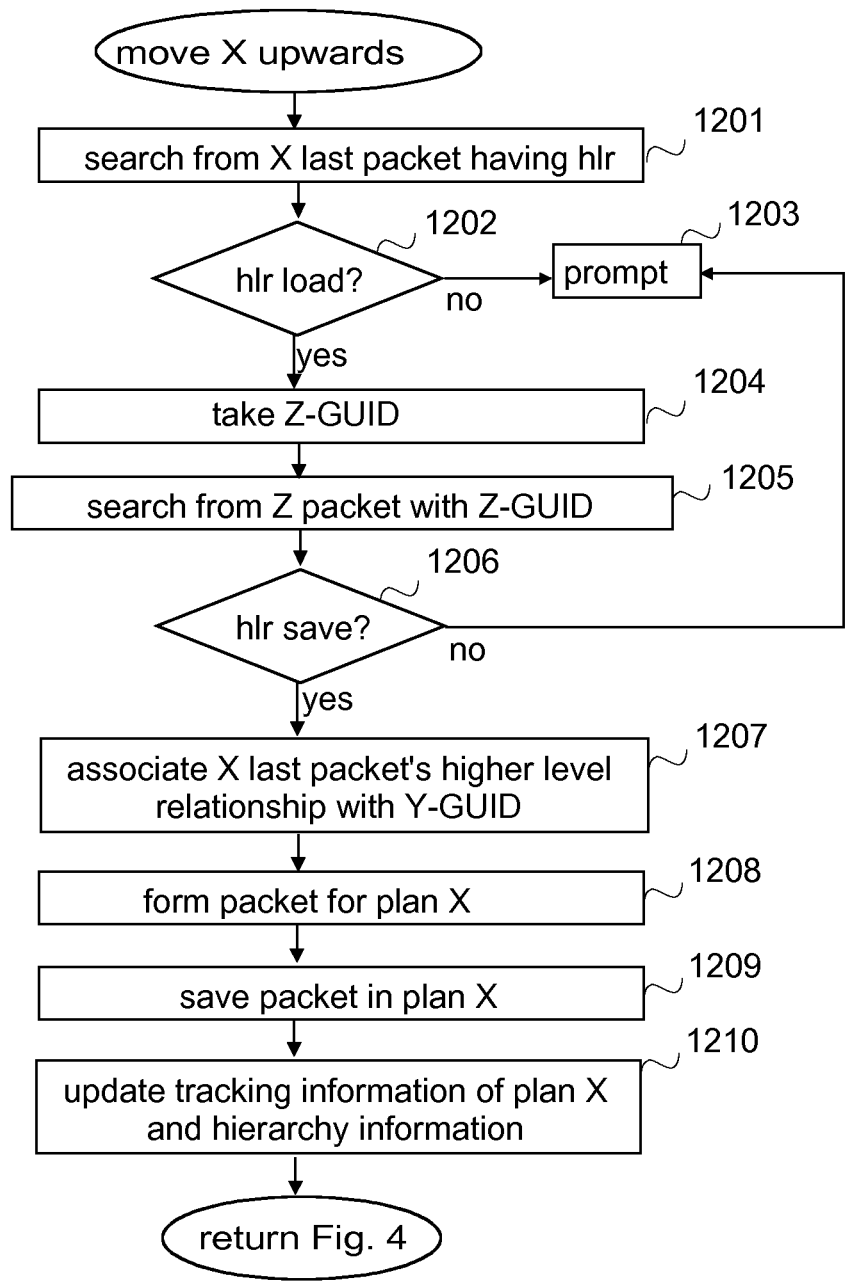
Figure 13:
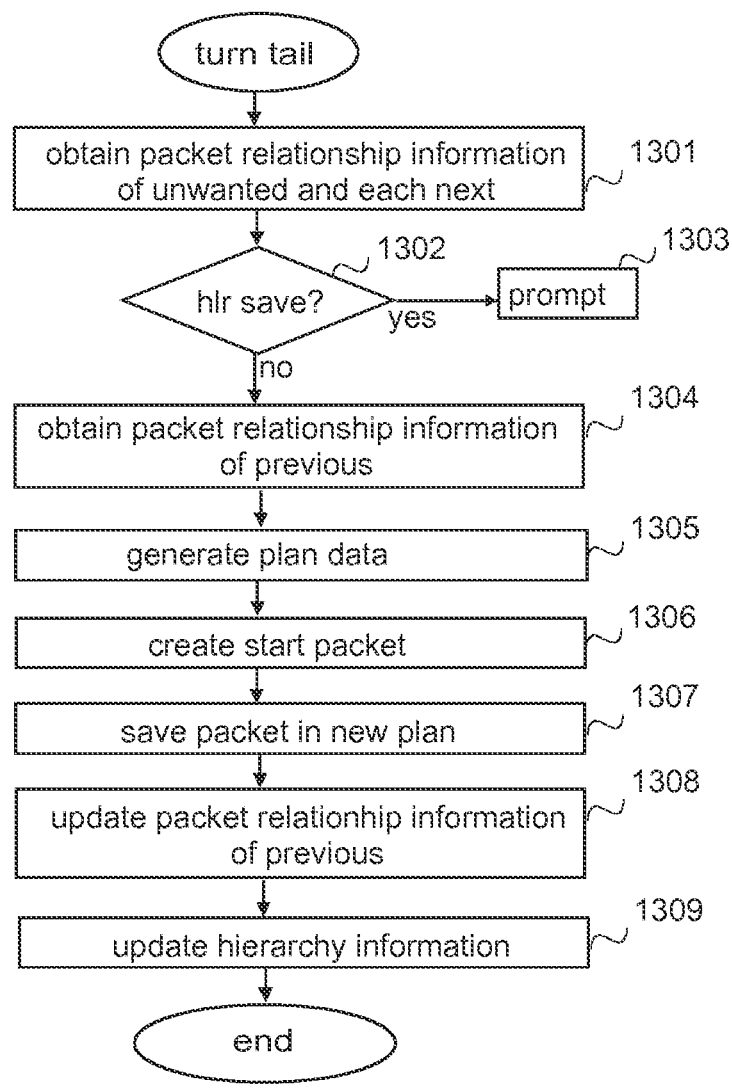

It may be that the thus obtained hierarchy structure needs to be reorganized. FIGS. 11 to 13 disclose a different hierarchy organizing functionality the plan managing unit may be configured to perform. In the examples below, it is assumed that corresponding plans are loaded to the working memory and have corresponding tracking information. Further, a packet is used as an example of a data item.

FIG. 11 illustrates a functionality in which a shared plan X is moved downwards so that it will be below a shared plan Z having the same higher level shared plan Y. For example, using the plans illustrated in FIG. 1, it may be that the plan B should be between the plan A and the master plan M.

When it is detected that the shared plan X is to be moved downwards below the shared plan Z with which the shared plan X has the same higher level shared plan Y, a last packet (i.e. the latest one stored in the shared plan X) containing in its packet relationship information in the value field of the higher relationship a GUID to the shared plan Y, i.e. Y-GUID, is searched for in step 1101 from the shared plan X. When the packet is found (denoted herein X-GUID), it is checked in step 1102 whether or not the higher level action is "load from higher level". In other words, it is checked whether or not the last higher level action was load. If not, the user is prompted in step 1103 that it is not possible to change the hierarchy. The user may also be prompted in step 1103 for the reason and/or provided with instructions as to which action(s) to perform so that changing the hierarchy will be possible. For example, the user may be prompted to perform "load from the plan X to higher level" before the shared plan X can be moved downwards.

If the last performed higher level action was load (step 1102), the GUID of the corresponding packet in the higher level shared plan Y, i.e. Y-GUID, is taken in step 1104 and a corresponding packet is searched for in step 1105 from the shared plan Z. When the packet (Z-GUID) is found, it is checked in step 1106 whether or not the packet contains as its higher level action "saved to higher level". If not, the process proceeds to step 1103 to prompt the user.

If the higher level action of the packet Z-GUID is "save to higher level" (step 1106), the change of hierarchy is possible since the packet saved from the shared plan Z in the higher level shared plan Y is loaded to the shared plan X. Therefore in step 1107, the higher level hierarchy information of the packet in the shared plan X and found in step 1101, i.e. X-GUID, is associated with the packet (Z-GUID) found in step 1105 in the shared plan Z. In other words, after step 1107, the higher level relationship information of X-GUID indicates Z-GUID instead of Y-GUID but the higher level action remains to be load, and the higher level relationship now refers to the shared Z plane and the hierarchy relationship is changed.

Then a new packet is formed in step 1108 for the plan X. In other words, a new GUID is obtained and the packet relationship information is set. The packet formed in step 1108 may contain modifications made to the local copy of the plan X after the packet indicated by the value field of current (so called "current packet") in the tracking information of the shared plan X was formed, including loaded information and information that may have been stored locally in a local packet formed later than the "current packet", if any such modifications exist. The packet relationship information of the packet formed in step 1108 contains as the previous packet the GUID of the current in the tracking information, and the value field of the higher level relationship, the value field of the last higher level action and the value field of the next packet has no association (or is left empty) and is set to be load.

Then the packet is saved in step 1109 in the shared plan X in the data repository, including updating the packet relationship information of the previous packet in the shared plan X so that the value field of next packet is associated with the GUID of the formed and saved packet. It is assumed that the saving is not an inline processing procedure and that no other user tries or succeeds to save a new plan between the shared plans Z and X during the saving procedure of step 1109. The tracking information of the plan X is also updated in step 1110 to have the GUID of the formed and saved packet as the value of the current, and the hierarchy information of the shared model is updated in step 1110 to reflect the amended situation. In other words, Y in plan X information is replaced by Z, X is moved from a lower level of plan Y to a lower level of plan Z.

FIG. 12 illustrates another exemplary functionality in which a hierarchy level is deleted. Using the situation after FIG. 11 as an example, if the shared plan X which is below the shared plan Z which, in turn, is below the shared plan Y is to be moved so that the shared plan X is no longer below the shared plan Z but the shared plan Y will be the higher level plan for the shared plans X and Z. For the sake of clarity, it is assumed that the hierarchy exists, i.e. the shared plans X and Z have at least one packet having a GUID in the value field of higher level relationship in the packet relationship information. If not, the request is rejected. The hierarchy change is allowable if the last performed higher level action in the shared plan X is "load from higher level", and the loaded packet was saved from the shared plan Z in the shared plan Y. However, there may be other higher level actions performed in the shared plan Z after that.

When it is detected that the hierarchy level of the shared plan X is to be moved upwards, a last packet (i.e. the latest one stored in the shared plan X) containing in its packet relationship information in the value field of the higher relationship a GUID to the shared plan Z, i.e. Z-GUID, is searched for in step 1201 from the shared plan X. When the packet is found (denoted herein X-GUID), it is checked in step 1202, whether or not the higher level action is "load from higher level". If not, the user is prompted in step 1203 that it is not possible to change the hierarchy. The user may also be prompted in step 1203 for the reason and/or provided with instructions as to which action(s) to perform so that changing the hierarchy will be possible.

If the last higher level action is "load from higher level", the GUID of the corresponding packet in the higher level shared plan Z, i.e. Z-GUID, is taken in step 1204 and a corresponding packet is searched for in step 1205 from the shared plan Z. When the packet is found, it is checked in step 1206 whether or not the packet contains as its higher level action "save to higher level". If not, the process proceeds to step 1203 to prompt the user.

If the higher level action of the packet Z-GUID is "save to higher level" (step 1206), the change of the hierarchy is possible. Therefore in step 1207, the higher level hierarchy information of the packet in the shared plan X and found in step 1201, i.e. X-GUID, is associated with the same packet (Y-GUID) in the higher level plan Y as that whereto the packet Z-GUID refers. In other words, after the step 1207, the higher level relationship information of X-GUID indicates Y-GUID instead of Z-GUID but the higher level action remains to be "load", and the higher level relationship now refers to the shared Y plane and the hierarchy relationship is changed.

Then a new packet is formed in step 1208 for plan X. In other words, a new GUID is obtained and the packet relationship information is set. The packet formed in step 1208 may contain modifications made to the local copy of plan X after the packet indicated by the value field of current (so called "current packet") was formed, including loaded information and information that may have been stored locally in a local packet formed later than the "current packet", if any such modifications exist. The packet relationship information of the packet formed in step 1208 contains as the previous packet the GUID of the current in the tracking information for the plan X, but the higher level relationship, the last higher level action and the next packet has no association (or is left empty).

Then the packet is saved in step 1209 in the shared plan X in the data repository, including updating the packet relationship information of the previous packet in the shared plan X so that the value field of the next packet is associated with the GUID of the formed and saved packet. It is assumed that the saving is not an inline processing procedure and that no other user tries or succeeds to save a new plan between plans X and Y during the saving procedure of step 1209. The tracking information of plan X is updated in step 1210 to have the GUID of the formed and saved packet as the value of the current, and the hierarchy information of the shared model is updated in step 1210 to reflect the amended situation. In other words, Z in plan X information is replaced by Y, X is moved from a lower level of plan Z to a lower level of plan Y.

FIG. 13 illustrates a functionality in which a plan contains a packet comprising a severe fault, like something destroying the plan. For example, using the plans illustrated in FIG. 1, it may be that a packet A4 is the one that is not wanted in the shared plan. In other words, it is an unwanted packet, and it is used as an example of such an unwanted packet below.

When an unwanted packet is detected, a "turn tail" action may be triggered. The "turn tail" action is preferably but not necessarily an inline operation requiring some kind of locking of the shared plan whose tail is to be turned. If no hierarchy information is separately maintained, this kind of hierarchy changes may be maintained using a side-channel queue to speed up detection of the changes, as compared with a solution in which the hierarchy is determined only using the packet relationship information.

In response to the "turn tail" action, packet relationship information of the unwanted packet (A4) and all next (subsequent) packets (A5) is obtained in step 1301. Then it is checked in step 1302 whether any of the packets has "save" in the value field of the higher level action. If any of them contains "save", no "turn tail" action can be performed, and the user is prompted in step 1303 correspondingly.

If no higher level save action has been performed in the unwanted packet or after it (step 1302), packet relationship information of a packet (A3) previous to the unwanted packet is obtained in step 1304. Then in step 1305 plan data is generated automatically, the plan data containing as a plan name "tail x", x illustrating consecutive numbering of tails, and it may contain as an additional information "faulty data".

Further, a start packet for the plan is created in step 1306. The packet relationship information of the start packet contains in the field value of the previous packet no information or "none", the field value of the next packet is associated with the GUID of the unwanted packet (A4), the GUID of the previous packet (A3) is added to the field value of the higher level relationship, and the value field of the higher level action is associated with information indicating that this plan is not to be used (i.e. none should use this plan). Information indicating that actions "load from the higher level" and "save to the higher level" are not allowed for this plan, and if one of the actions is tried, an error is returned, may be provided as side-channel information. A new GUID is obtained in step 1306 for the start packet but no actual content is added to the start packet even in implementations in which the start packet may contain actual content.

Then the packet is saved in step 1307 to be a new shared plan in the data repository. The packet relationship information of the unwanted packet (A4) is updated in step 1308 so that the value field of the previous packet is set to be the new GUID and the packet relationship of the previous packet (A3) is updated in step 1308 by emptying/deleting the association of the value field of the next packet, or setting it to "none". After that the packet A3 would be the last one in the plan A, and the packets A4 and A5 would have been moved to another plan (linked to the plan A via an empty packet (identified by the new GUID)). The hierarchy information of the shared model is updated in step 1309 to contain required information on the new plan, such as the name of this new plan, the name of the higher level plan of this new plan, adding this new plan as a new lower level plan to the higher level plan, etc.

In another implementation, the "turn tail" process also comprises checking whether the unwanted packet belongs to a plan that is a higher level plan for one or more other plans, and if it is, it is checked whether the unwanted packet has been loaded to the one or more plans, and if it has been loaded, "turn tail" is performed on the packet whereto the unwanted packet was loaded, the lower level packet becoming an unwanted packet of that level. The process is preferably performed recursively downwards in the hierarchy. An advantage of this is that faulty data is no longer used nor usable in the model.

Although not described above, the (packet) relationship information, or the packet itself separately from the relationship information, may contain flags for indicating whether the shared plan the packet belongs to is closed by the packet, or should be treated as a deleted one, for example. The flag values may then be used by the actions described above to determine whether or not to allow a snapshot, a load and/or a save from/in the plan, for example.

Figure 14:
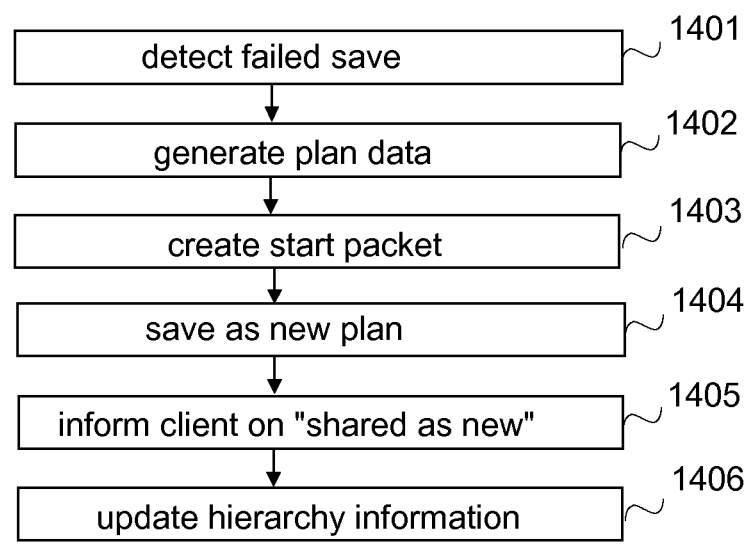

FIG. 14 illustrates a functionality according to an exemplary embodiment in which a database management system, or corresponding system, is configured to monitor the "save" action and provide a fallback solution when the "save" action fails. The database management system may comprise for this purpose a save monitoring unit, that may be implemented by hardware, firmware, software, or combinations thereof. For firmware or software, implementation can be through units/modules (e.g. procedures, functions, algorithms and so on) that perform the functions described herein.

Referring to FIG. 14, when the save monitoring unit detects in step 1401 that a client tries to save in a plan A but the save fails, for example because another client has locked the plan A because the other client is currently performing the save action. Another example may be that, referring to the situations described above with FIG. 6, the save monitoring unit detects that the packet indicated as current is searched for and the value field of the packet indicated as current indicates that a next packet exits, and the save monitoring unit is configured to determine whether or not loading packets is possible and if not possible, to determine that the save fails. Yet another example is that the save monitoring unit detects that after the load, while the packet is formed in step 607, a new packet is stored in the shared plan (i.e. answer to question of step 608) would be yes, the save monitoring unit may decide to treat the situation as a failed save. This is especially useful if the client is not configured to perform the check of step 608. (If the client is configured to perform the check of step 608, and the save monitoring unit decide to treat the situation as a failed save, it may "fool" the client by indicating that no next data item exists, i.e. by responding to a request asking whether or not during the time the packet was formed after the last loaded packet, one or more packets has been saved to the plan, that the last loaded packet is the last one in the plan even though there are one or more next packets.)

In response to the failed save, the save monitoring unit generates in step 1402 plan data for a new plan and creates in step 1403 a start packet for the new temporary plan. The plan data may correspond to the plan data described with FIG. 6. After that the start packet and the data item(s) the client tries to save in the plan A are saved in the new plan. In the example, the client is also informed in step 1405 that instead of the "save", "save as new" was performed. The hierarchy information is also updated in step 1406. Now the data is usable to the client and other clients as any other shared plan in the shared memory.

This way all work can be saved to the shared memory as a new plan, which can later be saved to the original plan by using "load higher" and then "save in higher" actions. This will result in changes being merged into the original plan, and adding a new packet in the created new plan, the new packet indicating that "save in higher" has happened, as is described with FIG. 9. Depending on an implementation, any client and/or the save monitoring unit or only the client that tried to perform "save action" but instead ended up to perform "save as new" action may perform the "save to higher" action.

An advantage provided by the above described functionality of the save monitoring unit, or corresponding functionality, is that the user is able to perform "save" in the shared memory at the time the user intended to save it.

In a still further embodiment, the client may be configured in the save mode only to form the packet, save the packet in the plan and update the tracking information, the save monitoring unit is configured to either save the packet as new plan or perform the loading, conflict handling, and forming a further packet which then will be saved to the shared plan.

It should appreciated that the client may be configured to perform the monitoring illustrated in FIG. 4, and one or more of the functionalities illustrated in FIGS. 5 to 13 are performed at the server, for example by the save monitoring unit.

The steps shown in FIGS. 4 to 14 are in no absolute chronological order, and some of the steps may be performed simultaneously or in an order different from the given one, and steps in one figure may be performed simultaneously or overlappingly with steps in another figure. Other functions can also be executed between the steps or within the steps. Some of the steps or part of the steps can also be left out. For example steps 703 to 706 in FIG. 7, or steps 1004 to 1007 in FIG. 10, may be left out. The steps, and steps in different Figures, can also be freely combined or divided into several parts.

It will be obvious to a person skilled in the art that as technology advances, the inventive concept can be implemented in various ways. The invention and its embodiments are not limited to the examples described above but may vary within the scope of the claims.

The invention claimed is:

1. A method comprising:
maintaining a shared data in a shared model, the shared data comprising a plurality of shared plans where each shared plan comprises one or more data items in a sequential order, the plurality of shared plans comprising a master plan and at least one parallel plan and a plurality of alternative plans, wherein at least one of the plurality of alternative plans are capable of being selected to be deleted upon storing of the shared model; and wherein each data item contains relationship information comprising an identifier, previous data item information, next data item information, and higher level relationship information;
associating a first data item stored in a shared plan selected from the group consisting of the master plan, the at least one parallel plan, and the plurality of alternative plans, with the relationship information indicating:
whether or not the first data item has a previous data item in the shared plan,
whether or not the first data item is associated with a next data item in the shared plan, and
whether or not the first data item has a relationship to a second data item in a higher level plan, information representing an existing relationship indicating that the first data item is a starting data item for the shared plan, and information representing a missing relationship indicating that the first data item is one of the one or more data items for the shared plan, wherein the plurality of data items further includes a third data item that is in a relationship with both the second data item in the higher level plan and another data item in the plurality of data items;
detecting that the first data item is unwanted;
obtaining the relationship information of the first data item and relationship information of data items subsequent to the first data item;
determining that none of the data items subsequent to the first data item are to be saved;
creating a new shared plan comprising a start packet, the start packet having no previous data item information but having next data information that indicates the next data item is the first data item; and
moving the first data item and the data items subsequent to the first data item to the new shared plan, the data items subsequent to the first data item being positioned subsequent to the first data item in the new shared plan.

2. A method as claimed in claim 1, further comprising:
forming a hierarchical structure using the relationship information so that if there is a previous data item, the first data item is placed after the previous data item, if there is a next data item, the first data item is placed before the next data item and if the first data item has the relationship, linking the first data item and the second data item in the higher level plan.

3. A method as claimed in claim 1, further comprising:
obtaining a working copy of the shared plan by taking a snapshot from the first data item; and
creating tracking information for the plan, the tracking information indicating the first data item as a current data item.

4. A method as claimed in claim 3, further comprising performing a primary load by loading to the working copy from the shared model at least the previous data item of the current data item, if there is a previous data item.

5. A method as claimed in claim 4, further comprising:
receiving a load instruction as a user input;
searching for the first data item indicated as the current data item from the shared model;
finding the first data item;
checking whether the found data item is associated with a next data item;
loading the associated data item to the working copy;
checking whether the associated data item is associated with a next data item; and
repeating the loading and checking of associated data items until there is an associated data item that is not associated with a next data item.

6. A method as claimed in claim 4, further comprising:
receiving a save instruction as a user input;
searching for the first data item indicated as the current data item from the shared model;
finding the first data item;
checking whether the found data item is associated with a next data item;
if the found data item is associated with a next data item, loading the associated data item to the working copy, checking whether the associated data item is associated with a next data item; and repeating the loading and checking of associated data items until there is an associated data item that is not associated with a next data item;
forming a further data item to be stored in the shared plan;
indicating the last loaded data item as a previous data item for the further data item;
storing the further data item with the indication of the previous data item in a shared memory;
associating the last loaded data item with information identifying the further data item as a next data item; and
updating the tracking information to indicate the further data item as the current data item.

7. A method as claimed in claim 4, further comprising:
receiving an instruction to load from a higher level shared plan as a user input;
searching for the third data item having a relationship to a higher level data item in the higher level plan from the shared plan;
finding the third data item;
searching for the higher level data item indicated in the relationship information of the third data item;
finding the higher level data item;
checking whether the found higher level data item is associated with a next data item;
loading the associated next data item from the higher level plan to the working copy;
checking whether the associated next data item is associated with a next data item; and
repeating the loading from the higher level plan to the working copy until there is an associated data item that is not associated with a next data item.

8. A method as claimed in claim 7, further comprising:
checking whether the found data item is associated with a next data item; and
searching for the higher level data item only and performing subsequent steps if the found data item is not associated with a next data item.

9. A method as claimed in claim 8, further comprising, if the found data item is associated with a next data item:
loading the associated data item to the working copy;
checking whether the associated data item is associated with a next data item;
repeating the loading and checking of associated data items until there is an associated data item that is not associated with a next data item, and only after that searching for the higher level data item and performing subsequent steps.

10. A method as claimed in claim 4, further comprising:
receiving an instruction to save in a higher level shared plan as a user input;
searching for the third data item having a relationship to a higher level data item in the higher level plan from the shared plan in the shared model;
finding the third data item;
searching for the higher level data item indicated in the relationship information of the third data item from the shared model;
finding the higher level data item;
checking whether or not the found higher level data item is associated with a next data item;
if not, forming a further higher level data item to be stored to the higher level shared plan;
indicating the found higher level data item as a previous data item for the further data item;
storing the further higher level data item with the indication of the previous data item in the shared memory; and
associating the found higher level data item with information identifying the further data item as a next data item.

11. A method as claimed in claim 10, further comprising in response to storing the further higher level data item:
forming a further data item;
indicating in the relationship information of the further data item the further higher level data item as the relationship in the higher level plan; and
storing the further data item to the shared plan.

12. A method as claimed in claim 1, further comprising:
receiving as a user input an instruction to move a first shared plan having a second shared plan as a higher level plan below a third shared plan having the second shared plan as the higher level plan;
checking whether or not there is in the second shared plan a data item that is stored from the third plan and loaded to the first plan as a last performed higher level action; and
if there is, moving the first shared plan below the third plan by associating in the first shared plan the higher level relationship information of a data item whereto the loading was performed with a data item in the third shared plan as the higher level relationship, the data item in the third plan indicating in its higher level relationship the data item stored in the second shared plan.

13. A method as claimed in claim 1, further comprising:
receiving as a user input an instruction to move a first shared plan having a second shared plan as a higher level plan below a third shared plan which is as the higher level plan of the second shared plan;
checking whether or not the last higher level relationship of the first shared plan indicates loading from the second shared plan;
if yes, checking whether or not a data item in the second shared plan and indicated by the higher level relationship of the first shared plan has been stored in the third shared plan;
if yes, moving the first shared plan below the third plan by associating in the first shared plan the higher level relationship information of a data item whereto the loading was performed with a data item in the third plan indicated by the relationship information of the data item in the second plan.

14. A method as claimed in claim 1, further comprising:
receiving as a user input an instruction to make a plan unusable from a data item;
checking whether or not storing in a higher level plan has been performed in the data item or after the data item;
if not, removing the association indicating the data item as a next data item.

15. A method as claimed in claim 4, further comprising:
receiving a save instruction as a user input;

searching for the first data item indicated as the current data item from the shared model;
finding the first data item;
checking whether the first data item is associated with a next data item;
if the first data item is associated with a next data item:
forming a starting data item for a new plan and a second data item, the starting data having as relationship information no previous data item, the second data item as the next data item, and a relationship to the found data item indicated as the current data item in the plan the save instruction was targeted to, the plan being a higher level plan for the new plan, the second data item having as relationship information the starting data item as the previous data item and no next data item and no relationship to a data item in the higher level plan; and
storing the starting data item and the second data item in the shared model as the new plan.

16. A method comprising:
maintaining in a shared memory a shared model that comprises a hierarchical plan structure, a highest plan comprising one or more data items, each of the data items indicating that it does not have a relationship to a data item in a higher level plan, the highest plan forming the final plan for the model, and one or more other shared plans, each other plan comprising one or more data items, at least one of the data items having a relationship to a data item in the highest plan or in a higher level plan between the other plan and the highest plan in the hierarchical plan structure, the hierarchical plan structure being formed by means of the relationships of the data items, each of the one or more other plans being a parallel plan intended to be saved in the highest plan or in the higher level plan when it is ready for storing, or alternative plans such that one of the alternative plans is selected to be saved in the highest plan or in the higher level plan, and other alternative plans that are not selected to be saved are capable of being selected to be deleted when the shared model is stored, wherein each data item contains relationship information comprising an identifier, previous data item information, next data item information, and higher level relationship information;
forming a first data item to be added to a first plan of the one or more other shared plans;
associating the first data item stored in a shared plan selected from the group consisting of the master plan, the at least one parallel plan, and the plurality of alternative plans with information identifying a previous data item in the shared plan;
storing the first data item in the shared model;
associating the previous data item with information identifying the first data item as a next data item, such that the first data item and the previous data item are in a sequential order in the first plan, wherein at least one data item in the first plan is in a relationship with both a data item in the higher level plan and another data item in the first plan;
detecting that the first data item is unwanted;
obtaining the relationship information of the first data item and relationship information of data items subsequent to the first data item;
determining that none of the relationship information of the data items subsequent to the first data item are to be saved;
creating a new shared plan comprising a start packet, the start packet having no previous data item information but having next data information that indicates the next data item is the first data item; and
moving the first data item and the data items subsequent to the first data item to the new shared plan, the data items subsequent to the first data item being positioned subsequent to the first data item in the new shared plan.

17. A method comprising:
maintaining in a shared memory a shared model comprising at least a first plan for the shared model, the first plan comprising at least a first data item;
forming a second data item for a second shared plan to be added to the shared model below the first shared plan, the second plan being parallel to the first plan or alternative to the first plan, the first plan forming part of the second plan up to and including the first data item, the second data item being a starting data item of the second plan, the second plan configured to include a third data item to be added to the second shared plan and in a sequential order to the second data item, wherein the second data item is in a relationship with both the first data item and the third data item, and wherein the first plan or second plan is capable of being selected to be deleted upon storing of the shared model when the second plan is alternative to the first plan, and wherein each of the first data item and the second data item contains relationship information comprising an identifier, previous data item information, next data item information, and higher level relationship information;
associating the second data item with higher level relationship information by identifying the first data item in the first shared plan and with information indicating whether the second plan is parallel or alternative;
storing the second data item in the shared memory;
detecting that the second data item is unwanted;
obtaining the relationship information of the second data item and relationship information of the third data item;
determining that the third data item is not to be saved;
creating a new shared plan comprising a start packet, the start packet having no previous data item information but having next data information that indicates the next data item is the second data item; and
moving the second data item and the third data item to the new shared plan, the third data item being positioned subsequent to the second data item in the new shared plan.

18. A method as claimed in claim 17, further comprising:
forming the third data item to be added to the second shared plan;
associating the third data item with information identifying the second data item as a previous data item in the second shared plan;
storing the third data item in the shared model; and
associating the second data item with information identifying the third data item as a data item that is subsequent to the second data item such that the second data item and the third data item are in the second shared plan and in a sequential order.

19. A method as claimed in claim 17, wherein the shared model is for building information modelling in a multiuser environment.

20. A method as claimed in claim 19, wherein the shared model comprises a hierarchical plan structure that comprises a highest plan comprising one or more data items, each of the data items indicating that it does not have a relationship to a data item in a plan that is at a higher level; and one or more other plans, each other plan comprising one or more data items, at least one of the data items having a relationship to a data item in the highest plan or in a higher level plan between the other plan and the highest plan in the hierarchical plan structure, the hierarchical plan structure being formed by means of the relationships of the data items.

21. An apparatus comprising
at least one processor; and
at least one memory including computer program code;
the at least one memory and the computer program code being configured to, with the at least one processor, cause the apparatus at least to:
maintain, in a shared model a shared data accessible by a user via a user apparatus, the shared data comprising a plurality of shared plans where each shared plan comprises one or more data items in a sequential order, the plurality of shared plans comprising a master plan and at least one parallel plan and a plurality of alternative plans, wherein at least one of the plurality of alternative plans are capable of being selected to be deleted upon storing of the shared model; and wherein each data item contains relationship information comprising an identifier, previous data item information, next data item information, and higher level relationship information;
associate a first data item stored in a shared plan selected from the group consisting of the master plan, the at least one parallel plan, and the plurality of alternative plans with relationship information indicating whether or not the first data item has a previous data item in the shared plan, whether or not the first data item is associated with a next data item in the shared plan, and whether or not the first data item has a relationship to a second data item in a higher level plan, information representing an existing relationship indicating that the first data item is a starting data item for the shared plan, and information representing a missing relationship indicating that the first data item is one of the one or more data items for the shared plan, wherein the plurality of data items further includes a third data item that is in a relationship with both the second data item in the higher level plan and another data item in the plurality of data items;
detect that the first data item is unwanted;
obtain the relationship information of the first data item and relationship information of data items subsequent to the first data item;
determine that none of the data items subsequent to the first data item are to be saved;
create a new shared plan comprising a start packet, the start packet having no previous data item information but having next data information that indicates the next data item is the first data item; and
move the first data item and the data items subsequent to the first data item to the new shared plan, the data items subsequent to the first data item being positioned subsequent to the first data item in the new shared plan.

22. An apparatus comprising
at least one interface configured to provide access to a shared memory;
at least one processor; and
at least one memory including computer program code;
the at least one memory and the computer program code being configured to, with the at least one processor, cause the apparatus at least to
load from the shared memory comprising a shared model comprising at least a first plan for the shared model, the first plan comprising at least a first data item at least information on the first data item;
form a second data item for a second shared plan to be added to the shared model below the first shared plan, the second plan being parallel to the first plan or alternative to the first plan, the first plan forming part of the second plan up to and including the first data item, the second data item being a starting data item of the second plan, the second plan configured to include a third data item to be added to the second shared plan and in a sequential order to the second data item, wherein the second data item is in a relationship with both the first data item and the third data item, and wherein the first plan or second plan is capable of being selected to be deleted upon storing of the shared model when the second plan is alternative to the first plan, and wherein each of the first data item and the second data item contains relationship information comprising an identifier, previous data item information, next data item information, and higher level relationship information;
associate the second data item with higher level relation information by identifying the first data item in the first shared plan and with information indicating whether the second plan is parallel or alternative;
store the second data item in the shared memory;
detect that the second data item is unwanted;
obtain the relationship information of the second data item and relationship information of the third data item;
determine that the third data item is not to be saved;
create a new shared plan comprising a start packet, the start packet having no previous data item information but having next data information that indicates the next data item is the second data item; and
move the second data item and the third data item to the new shared plan, the third data item being positioned subsequent to the second data item in the new shared plan.

23. A non-transitory computer-readable storage medium having computer-readable instructions executable by a computer such that, when executing said instructions, said computer will:
maintain, in a shared model a shared data accessible by a user via a user apparatus, the shared data comprising a plurality of shared plans where each shared plan comprises one or more data items in a sequential order, the plurality of shared plans comprising a master plan and at least one parallel plan and a plurality of alternative plans, wherein at least one of the plurality of alternative plans are capable of being selected to be deleted upon storing of the shared model; and wherein each data item contains relationship information comprising an identifier, previous data item information, next data item information, and higher level relationship information;
associate a first data item stored in a shared plan selected from the group consisting of the master plan, the at least one parallel plan, and the plurality of alternative plans with relationship information indicating:
whether or not the first data item has a previous data item in the shared plan, whether or not the first data item is associated with a next data item in the first shared plan, and whether or not the first data item has a relationship to a second data item in a higher level plan, information representing an existing relationship indicating that the first data item is a starting data item for the first shared plan, and information representing a missing relationship indicating that the first data item is one of the one or more data items for the first shared plan, wherein the plurality of data items in the sequential order further includes a third data item that is in a relationship with the second data item in the higher level plan;

detecting that the first data item is unwanted;

obtaining the relationship information of the first data item and relationship information of data items subsequent to the first data item;

determining that none of the data items subsequent to the first data item are to be saved;

creating a new shared plan comprising a start packet, the start packet having no previous data item information but having next data information that indicates the next data item is the first data item; and moving the first data item and the data items subsequent to the first data item to the new shared plan, the data items subsequent to the first data item being positioned subsequent to the first data item in the new shared plan.

24. A system comprising at least one or more first computing apparatuses, each comprising a data storage for storing a shared model comprising a hierarchical plan structure that comprises a highest plan comprising one or more data items, each of the data items in the highest plan indicating that it does not have a relationship to a data item in a higher level plan, the highest plan forming the final plan for the model, and one or more other shared plans, each other plan comprising one or more data items, at least one of the data items in a shared plan having a relationship to a data item in the highest plan or in a higher level plan between the other plan and the highest plan in the hierarchical plan structure, the hierarchical plan structure being formed by means of the relationships of the data items, each of the one or more other plans being a parallel plan intended to be saved in the highest plan or in the higher level plan when it is ready for storing, or alternative plans such that, one of the alternative plans is selected to be saved in the highest plan or in the higher level plan, and other alternative plans that are not selected to be saved are capable of being selected to be deleted when the shared model is stored, wherein each data item contains relationship information comprising an identifier, previous data item information, next data item information, and higher level relationship information;

one or more second computing apparatuses, a second apparatus being configured to have access to the data storage and configured to form a first data item to be added to one of the one or more shared plans, associate the first data item stored in a shared plan selected from the group consisting of the master plan, the at least one parallel plan, and the plurality of alternative plans with information identifying a previous data item in the shared plan, store the first data item in the shared model, and associate the previous data item with information identifying the first data item as a next data item, such that the first data item and the previous data item are in a sequential order in the shared plan, wherein at least one data item in the shared plan is in a relationship with both a data item in the higher level plan and another data item in the shared plan;

detecting that the first data item is unwanted;

obtaining relationship information of the first data item and relationship information of data items subsequent to the first data item;

determining that none of the data items subsequent to the first data item are to be saved;

creating a new shared plan comprising a start packet, the start packet having no previous data item information but having next data information that indicates the next data item is the first data item; and moving the first data item and the data items subsequent to the first data item to the new shared plan, the data items subsequent to the first data item being positioned subsequent to the first data item in the new shared plan.

* * * * *